United States Patent [19]

Endo et al.

[11] Patent Number: 5,446,493
[45] Date of Patent: Aug. 29, 1995

[54] SOLID STATE IMAGE SENSORS FOR REPRODUCING HIGH DEFINITION IMAGES

[75] Inventors: Yukio Endo; Nozomu Harada; Hidenori Shibata; Yoshiyuki Matsunaga, all of Kanagawa, Japan

[73] Assignee: Kabushiki Kaisha Toshiba, Kawasaki, Japan

[21] Appl. No.: 207,267

[22] Filed: Mar. 9, 1994

Related U.S. Application Data

[60] Continuation of Ser. No. 95,031, Jul. 8, 1993, abandoned, which is a continuation of Ser. No. 940,743, Sep. 8, 1992, abandoned, which is a continuation of Ser. No. 815,606, Jan. 3, 1992, abandoned, which is a continuation of Ser. No. 489,259, Mar. 5, 1990, abandoned, which is a division of Ser. No. 157,718, Feb. 19, 1988, Pat. No. 4,972,254.

[30] Foreign Application Priority Data

Feb. 24, 1987 [JP] Japan .................................. 62-39171
Jun. 26, 1987 [JP] Japan ................................. 62-157935
Sep. 30, 1987 [JP] Japan ................................. 62-246088

[51] Int. Cl.$^6$ ............................................. H04N 5/335
[52] U.S. Cl. ...................................... 348/320; 348/273; 348/322
[58] Field of Search ............... 348/272, 273, 274, 275, 348/226, 311, 316, 317, 320, 321, 322, 323, 294; H04N 5/335

[56] References Cited

U.S. PATENT DOCUMENTS 4,839,734 6/1989 Takemura ..................... 358/213.22

Primary Examiner—Michael T. Razavi
Assistant Examiner—Tuan V. Ho
Attorney, Agent, or Firm—Foley & Lardner

[57] ABSTRACT

A solid state image sensor has a photosensing region formed on a substrate. The photosensing region has a plurality of photocells for receiving an incident image. The photosensing region is capable of changing image sampling modes by relatively shifting image sampling points for the incident image. In the photosensing region, a plurality of first transfer elements are formed and the first transfer elements receive the signal charges from adjoining photocells and transfer them out. Further, a temporary storage region is formed on the substrate having a plurality of second transfer elements therein for each of the first transfer elements. Each of the second transfer elements has a capacity to accommodate all of the signal charges of a corresponding first transfer elements which are read out from the photocells at the same time. A plurality of gate elements are respectively formed between each of the first transfer elements and their corresponding plurality of second transfer elements. Each gate elements changes transfer direction from one of the first transfer elements between at least two of the second transfer elements based on the sampling mode for the incident image. Third transfer elements are formed adjacent to the temporary storage region. The third transfer elements repeat a readout cycle of receiving the signal charges from a plurality of second transfer elements and then transferring them out.

14 Claims, 38 Drawing Sheets

FIG. 7a
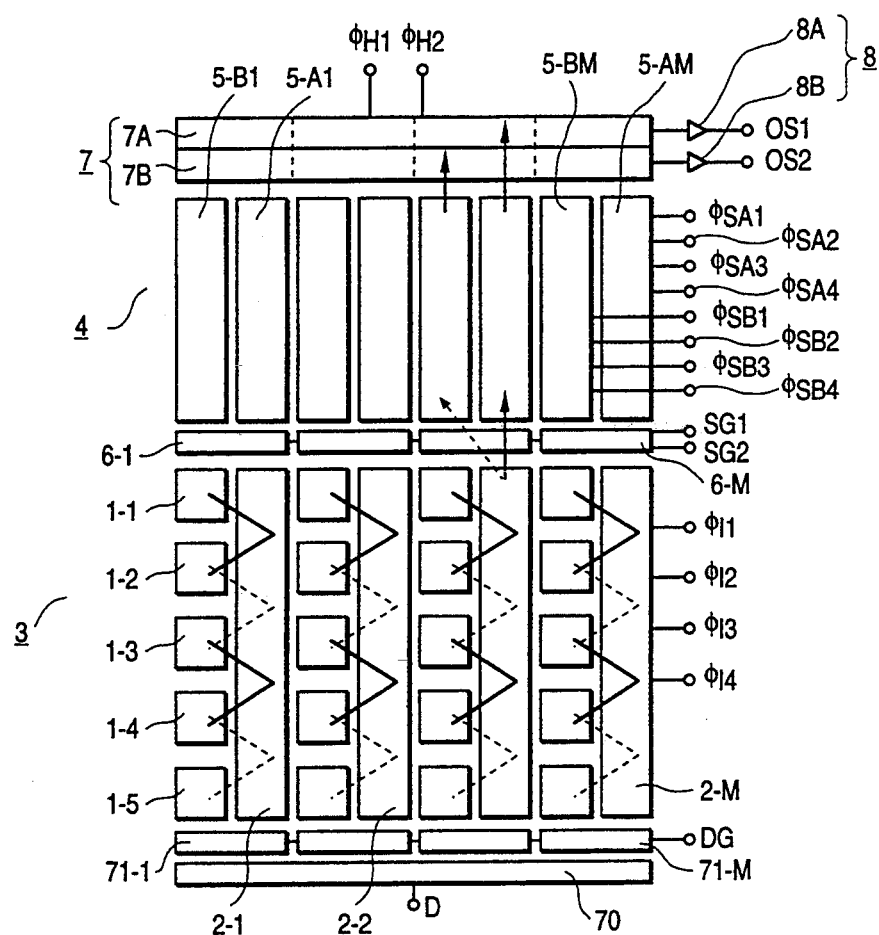
FIG. 7b
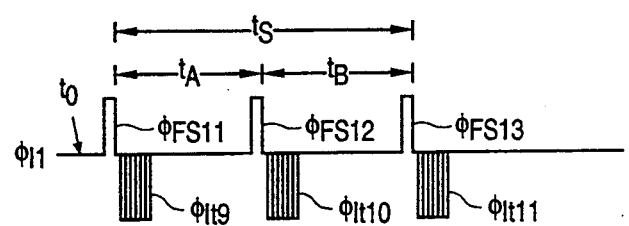
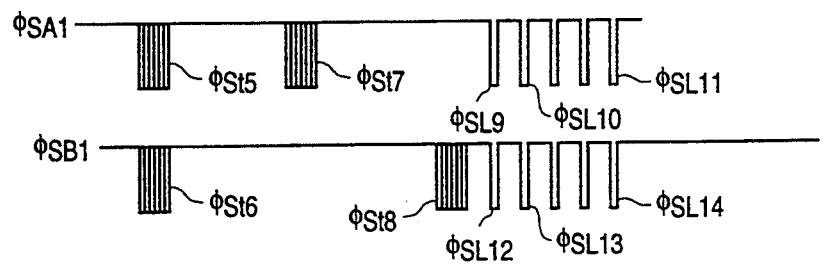

FIG. 12

CCD CHANNEL 5-A

CCD CHANNEL 5-B

FIG. 31a
CCD CHANNEL 5-A
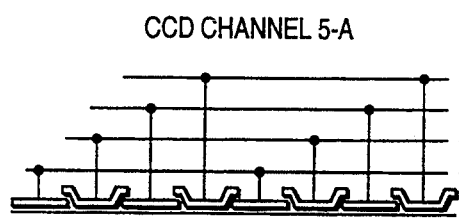
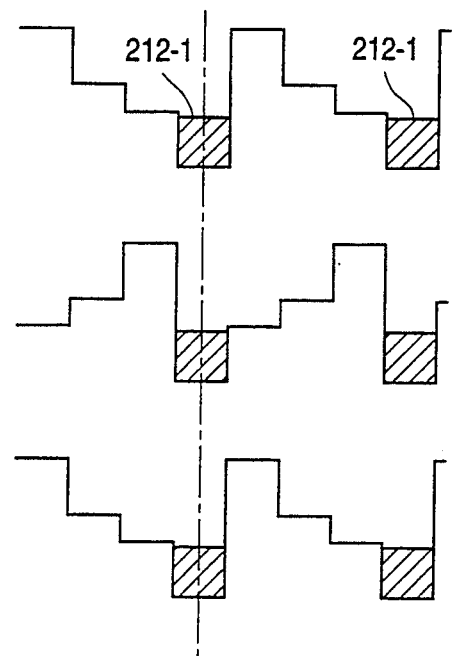
FIG. 31b
CCD CHANNEL 5-B
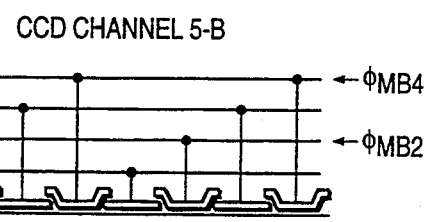
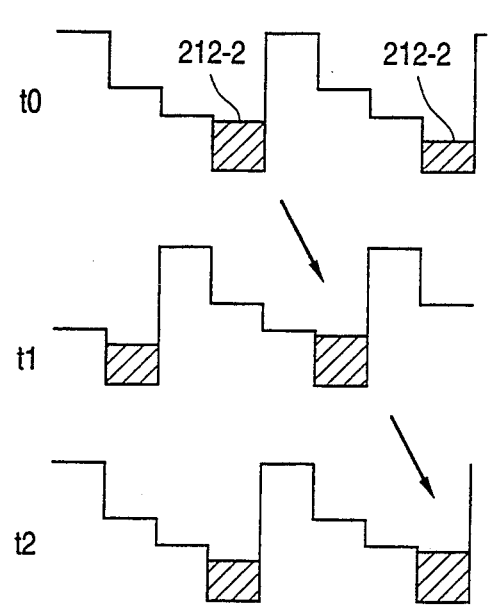

SOLID STATE IMAGE SENSORS FOR REPRODUCING HIGH DEFINITION IMAGES

This application is a continuation of application Ser. No. 08/095,031, filed Jul. 8, 1993, abandoned, which is continuation application of Ser. No. 07/940,743, filed Sep. 8, 1992, abandoned, which is a continuation of application Ser. No. 07/815,606, filed Jan. 3, 1992, abandoned, which is a continuation of application Ser. No. 07/489,259, filed Mar. 5, 1990, now abandoned, which is a divisional of application Ser. No. 07/157,718, filed Feb. 19, 1988, U.S. Pat. No. 4,972,254.

BACKGROUND OF THE INVENTION

The present invention relates to solid state image sensors, and more particularly to solid state image sensors for reproducing high definition images.

Charge transfer devices (CTD) such as charge coupled devices have been known as solid state image sensors adaptable for standard television systems, for example, the National Television Systems Committee (NTSC) system, and have found a variety of applications. In the NTSC system, the number of horizontal scanning lines is 512, the scanning system is of an interlacing scanning type with two fields for one frame, and the aspect ratio is 3:4. The number of picture elements of a CCD adaptable for the standard TV system, for example, in an interline transfer type CCD (IT-CCD) is approximately 500 (vertical)×400 (horizontal). It is also reported that the number of horizontal scanning lines is planned to increase to a level of 1,000 or more, for example, 1,125.

The solid state image sensor such as the IT-CCD is superior to an image pick-up tube in many respects. For example, the image sensor is small in size, light in weight, and high in reliability. Further, it is essentially free from pattern distortion, sticking, and so forth. Having such excellent features provides for an increasing number of applications in many fields, for example, ITV, small commercial video cameras, etc.

In the IT-CCD, signal charges stored in a photodiode array are simultaneously transferred to the adjacent vertical CCDs (V CCDs) disposed in the photodiode array or photosensing region. Then, the signal charges are read out from a horizontal CCD (H CCD), through a respective readout cycle. During the read out from the chip, the next integration of signal charges is also carried out. Conventionally, signal charges from every other photodiode along the V CCD or signal charges from photodiode pairs are read out in the first field. And in the second field, the signal charges from the remaining photodiodes or photodiode pairs are read out to complete one frame image. The readout of signal charges of the second field is performed after the signal charges of the first field are completely read out from the chip. The readout is synchronized with the interlacing scanning on the TV. Therefore, each field has 256 lateral scanning lines and the fields are interposed between each other, based on different sampling points, i.e., different image sampling modes of the incident light image. The operation of reading out from every other photodiode is called "frame integration." On the other hand, reading out from pairs of photodiodes is called "field integration."

As for the IT-CCD, various studies have been reported. One of the studies relates to incorporation of a storage region into the IT-CCD chip. ("A New Configuration of CCD Imager with a Very Low Smear Level -FIT-CCD Imager," K. Horii et al. *IEEE Transactions on Electron Devices,* Vol. ED-31, No. 7, July, 1984).

By introducing a CCD storage region between the photosensing region and the H CCD region for temporary storage of signal charges, the mixing of smear charges diffused from the depletion layer beneath the photodiode region with signal charges transferring in the V CCDs is prevented. This is because the data output speed from the V CCDs is not restricted by the scanning speed of the lateral scanning lines of the TV. In other words, the sweep out of signal charges from the V CCDs can be accomplished at high frequency.

In the aforementioned report, the storage region contains two parallel one-half length vertical CCDs for each V CCd in the photosensing region. The parallel arranged two V CCDs in the storage region accept the signal charges from the corresponding V CCD, by switching a selective gate at every other signal charge transferred from the V CCD. However, because only the signal charges corresponding to one sampling point group are read out from the CCD chip in one field, as mentioned, each vertical CCD in the storage region only has a memory capacity sufficient to accommodate one-half of the signal charges in the corresponding V CCD of the photosensing region. Further, in this instance, all the vertical CCDs in the storage region are driven with the same timing. Thus, the image sampling mode does not change during the readout cycle from the chip.

However, there are still further problems remaining in the image sensors. One important problem is the resolution in the present device. FIG. 1 shows a color filter arrangement formed on a conventional frame integration type IT-CCD. In FIG. 1, each filter is colored green (G), blue (B) or red (R), and is respectively formed on one element including one photodiode. In an odd numbered field, the signal charges from every other row (horizontal) of the photodiode array are read out from the chip. Successively, in the even number field, the signal charges from the rest of the rows of the photodiode array are read out. ("Interline Imaging Type Single Plate Color Camera," K. Ooi et al, *Journal of Television Institute,* P. 111-112, 1981 (Japan)).

As will be seen in FIG. 1, with attention to the readout rows of odd or even numbered fields, the signal charges corresponding to green are obtained, jumping one cell in the horizontal direction in each field. However, signal charges of blue and red are only obtained in each field at every fourth photodiode along the horizontal direction. For the vertical direction each color arises every fourth photodiode in one field. Besides, this structure is so designed as to form a luminance signal based upon the relation $Ye = 2G + \frac{1}{2}(R + B)$ based on the color signals. After performing the scanning of the odd number field, the even number field is scanned according to the signals from the photodiodes.

In FIG. 1, the minimum unit necessary to complete one frame is composed of 4×4 elements. The rough arrangement for color filters leads to a moire effect and the appearance of dummy signals. Also, it is readily understood that the low resolution power which depends on the area of the minimum unit of the color filters is considerable.

These problems occur for the reason that conventional CCD chips are unable to read out the signal charges with different image sampling points, in one field.

SUMMARY OF THE INVENTION

Accordingly, an object of the present invention is to provide a new and improved solid state image sensor.

Another object of the present invention is to provide a solid state image sensor capable of reading out signal charges including different sampling modes for an incident image, in one field period.

Another object of the present invention is to provide a solid state image sensor having improved resolution power for an incident image.

A solid state image sensor according to the present invention comprises a substrate and a photosensing region formed on the substrate. The photosensing region has a plurality of photocells for receiving an incident image and generating and storing signal charges in response thereto. The photosensing region is capable of changing its sampling mode by shifting its sampling points to the incident image.

A plurality of first transfer means are formed in the photosensing region, the first transfer means receive the signal charges from their adjoining photocells and transfer them out. A temporary storage region is formed on the substrate, having a plurality of second transfer means therein for each of the first transfer means, the second transfer means being able to be driven independently between ones which belong to same first transfer means, and each of the second transfer means having a capacity to accommodate all of the signal charges in the corresponding first transfer means. A plurality of gate means are respectively formed between each of the first transfer means and their corresponding plurality of second charge transfer means. Each gate means changes transfer direction from the corresponding first transfer means to one of the corresponding second transfer means in accordance with the sampling mode of the incident image.

BRIEF DESCRIPTION OF THE DRAWINGS

The present invention is best understood by reference to the accompanying drawings, in which:

FIG. 2b shows clock pulses applied to the device of FIG. 2a;

FIG. 3a is an illustration of an arrangement of color filters for use with the device shown in FIG. 2a;

FIG. 4a is a plan view of the photosensing region of the device shown in FIG. 2a;

FIG. 4b shows a cross sectional view of the photosensing region of FIG. 4a;

FIG. 4c shows clock pulses applied to the vertical CCDs in the photosensing region of FIG. 4a;

FIGS. 5b and 5c are clock pulses applied to the terminals in FIG. 5a;

FIG. 6b shows a cross sectional view of the photosensing region of the device in FIG. 6a;

FIG. 7a shows a plan view of the solid state image sensor of a third embodiment of the present invention, which is adapted for use with an electronic camera;

FIG. 7b shows clock pulses applied to the device shown in FIG. 7a;

FIG. 8b shows clock pulses applied to the device in FIG. 8a;

FIG. 11b shows clock pulses applied to the device shown in FIG. 11a;

FIGS. 11c and 11d are diagrams for describing output signals of the solid state image sensor in FIG. 10a;

FIG. 12 is a layout showing a modified embodiment of the synchrovision solid state image sensor;

FIG. 13b shows clock pulses for the device in FIG. 13a;

FIGS. 16b and 16c show the combination steps in the device shown in FIG. 16a;

FIGS. 19a through 19d show transferring steps of the device shown in FIG. 18a;

FIG. 21b is a detailed view of the structure of FIG. 21a.

FIG. 30b is a timing chart showing waveforms of clock pulses for transferring signal charges in the second V CCDs; and FIGS. 31a and 31b are illustrations showing the transferring to signal charges in FIGS. 30a and 30c.

DETAILED DESCRIPTION OF THE PREFERRED EMBODIMENTS

Several embodiments of the present invention are described as follows, referring to the attached drawings.

EXAMPLE 1

Figure 2A:
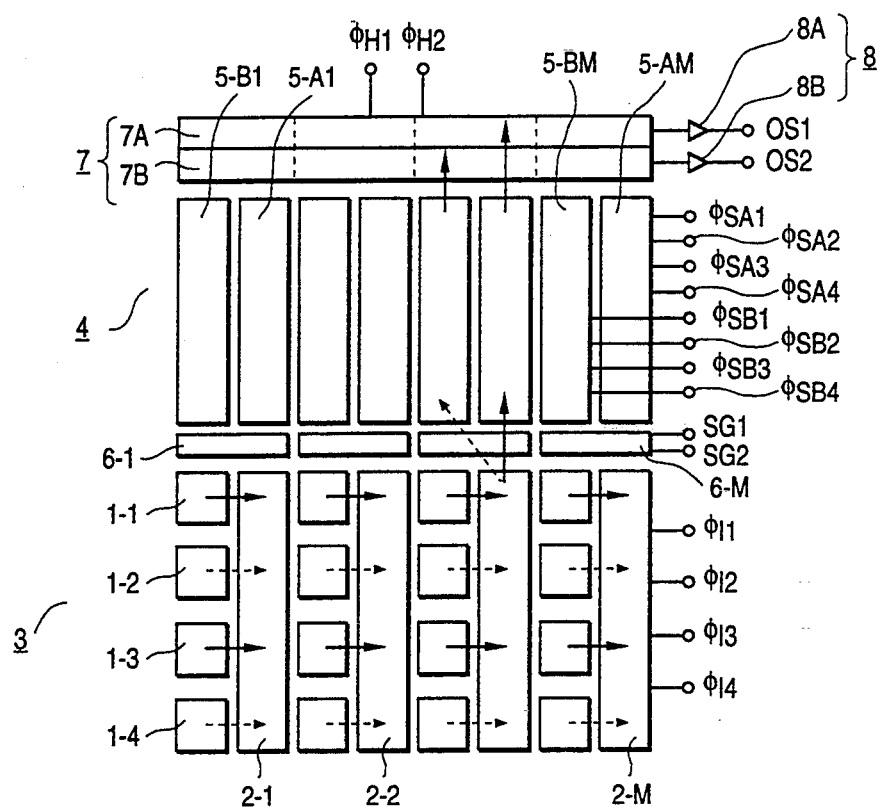
FIG. 2a is a plan view of the solid state image sensor of the first embodiment of the present invention using frame integration.
Figure 2B:
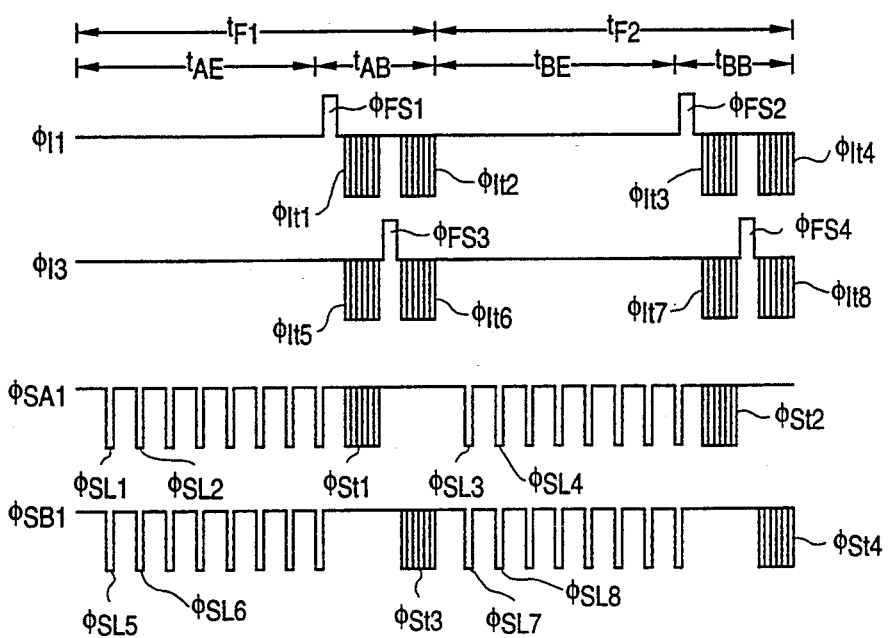

FIG. 2a shows an overall arrangement on a solid state image sensor chip of this first embodiment, and FIG. 2b shows waveforms of the timing pulses. The manner of photosensing is the frame integration type.

In FIG. 2a, a number of photodiodes 1-1-, 1-2, —, 1-N and a plurality of first vertical CCD registers (first V CCDs) 2-1, 2-2, —, N-M are arranged in the a photosensing region 3 of a semiconductor substrate. The first V CCDs are driven, for example, by a four phase drive pulse applied to the terminals $\phi I1$–$\phi I4$. In a temporary storage region 4 which is adjacent to the photosensing region 3, two groups of second vertical CCds A (5A1, 5A2, —, 5AM) and second vertical CCDs B (5B1, 5B2, —, 5BM) are formed. The vertical CCDs of group A are driven by the terminals $\phi SA1$–$\phi SA4$; on the other hand, the group B are driven by their terminals $\phi SB1$–$\phi SB4$. The four phase clock pulses are applied to the second V CCDs A and B independently. In the region between photosensing region 3 and temporary storage region 4, a plurality of gate means 6-1, 6-2, —, 6-M are inserted for providing a transfer direction. On the top, a horizontal CCD register (H CCD) 7 is disposed. In this embodiment, the H CCD is of a two lines type consisting of 7A and 7B. And amplifiers 8A and 8B are connected between output terminals OS1, OS2 and the H CCDs 7A and 7B, respectively. The two line type H CCD 7 is commonly driven by the two phase clock pulses applied to the terminals $\phi H1$, $\phi H2$.

Photodiodes of small scale are shown in FIG. 2a for ease of illustration; however, there are more photodiodes arranged in the actual device. In the device thus arranged, the number of the transfer stages along the vertical (column) direction of the first V CCD is one-half that of the photodiodes. For example, in the present NTSC system, the number of transfer stages in the first V CCD is approximately 256, and the number of photodiodes along the vertical direction is about 512. The number of photodiodes and transfer stages in the first V CCDs has to be doubled when the number of horizontal scanning lines increases to 1,125. By applying field shift pulses, the signal charges are loaded into the first V CCds at a same time.

Each of the second V CCDs (5-A1, 5-A2, —, 5-AM, and 5-B1, 5-B2, —, 5-BM) has 256 or more transfer stages in the present embodiment and, therefore, has a capacity to accommodate all of the signal charges in the corresponding first V CCD. The gate means 6-1, 6-2, —, 6-M are respectively formed between each of the first V CCds (2-1, 2-2, —, 2-M) and their corresponding pairs of second vertical CCDs A (5-A1, 5-A2, —, 5-AM) and B (5-B1, 5-B2, —, 5-BM). Since the image sampling mode is changed in one field, the gate means change their transfer direction due to the sampling mode for the incident light image.

The incident image is focused onto the photosensing region 3 with a lens system (not shown).

Hereinafter, the operations of timing pulses are described referring to FIG. 2b. With drive terminals $\phi I1$–$\phi I4$, $\phi SA1$–$\phi SA4$, SB1–SB4 and $\phi H1$–$\phi H2$, as representative, $\phi I1$ and $\phi I3$ which, respectively, serve as field shift pulses and $\phi SA1$, $\phi SB1$, are shown in FIG. 2b.

During the effective period tAE in the first field period tF1, signal charges are integrated in the photodiode array. A field shift pulse $\phi FS1$ is applied to the terminal $\phi I1$ to read out the signal charges from photodiodes (1-1, 1-3, —) to the first V CCD 2-1, 22, 2, —, 2-M as indicated by solid lines in FIG. 2a. Then in a vertical blanking period tAB, the signal charges are transferred to the second V CCDs A (5-A1, 5-A2, —, 5-AM) by applying four phase clock pulses to the first V CCDs (2-1, 2-2, —, 2-M) and the second V CCDs A (5-A1, 5-A2, —, 5-AM). The four phase clock pulses applied at this timing are illustrated in FIG. 2b, as pulses $\phi IT1$, $\phi IT5$ and $\phi ST1$. Then, in the same field, the remaining signal charges are read out from the photodiodes (1-2, 1-4, —) to the first V CCds (2-1, 2-2, —, 2-M), and then, are transferred to the second V CCDs B (5-B1, 5-B2, —, 5-BM) by applying four phase clock pulses to the first V CCDs (2-1, 2-2, —, 2-M) and the second V CCds (5-B1, 5-B2, —, 5-BM). The pulses applied with their relative timing are shown in FIG. 2b as $\phi IT2$, $\phi IT6$ and $\phi ST3$. The second readout from the photodiodes is denoted as broken lines in FIG. 2a. The periods between field shift pulses of clocks $\phi I1$ and $\phi I3$ are also designed to be same. The change in transfer direction between the second V CCDs A and the second V CCDs B is provided by an electric signal supplied to the gate means 6-1, 6-2, —, 6-M. The signal charges loaded in the second V CCDs A and B, or temporary storage region, are read out from output terminals OS1, OS2 through the H CCDs 7A, 7B and amplifiers, 8A, 8B in the second field, by repeating the readout cycle of the H CCD 7. This readout process comprises receiving the signal charges from each second V CCD A, B (5-A1, 5-A2, —, 5-AM and 5-B1, 5-B2, —, 5-BM) and then transferring them out, horizontal row by row. This cycle repeats until all the signal charges are read out from the chip. This readout is done in the effective period tBE of the second field period, tF2 ($\phi SL3$, $\phi SL4$, $\phi SL7$, $\phi SL8$). The transfer from the first V CCDs to the second V CCDs A, B is carried out in the vertical blanking period tAB on the TV, together with the next integration of the signal charges. Because of the use of a two line H CCD 8 in this embodiment, the signal charges of the second V CCDs A are loaded into the H CCD 7A; on the other hand, charges from the second V CCDs B are loaded into the H CCD 8B.

As described, the signal charges of the A and B groups respectively having different image sampling points therebetween are stored in the temporary storage region and then are output from the chip in one field. Although the operation in the photosensing region is basically the frame integration type, the number of the signal charges readout are doubled as compared with the conventional IT-CCD.

Figure 3A:
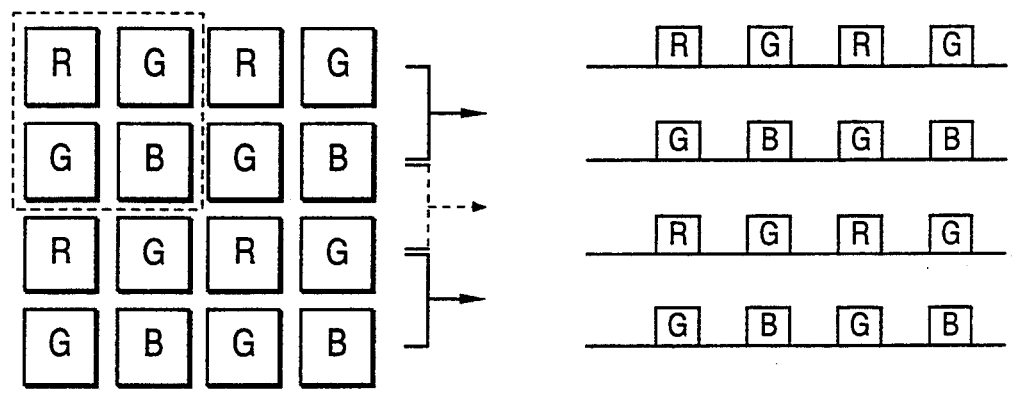

FIG. 3a illustrates an arrangement of color filters formed on the photosensing region 3 of the device of FIG. 2a.

It is assumed that the arrangement of color filters shown is formed on, for example, the first to fourth horizontal rows counted from the top of the photodiode array in FIG. 2. In the effective period tBE of the second field period tF2, the signal charges stored in the first field period tF1 are sequentially read out from the chip, being synchronized with the horizontal scanning lines on the TV. Accordingly, in the even numbered field, the signal charges R—G—R—G are obtained from the top row of the photodiode array. At the same time, the signal charges G—B—G—B are obtained from the second row of the photodiode matrix.

Figure 3B:
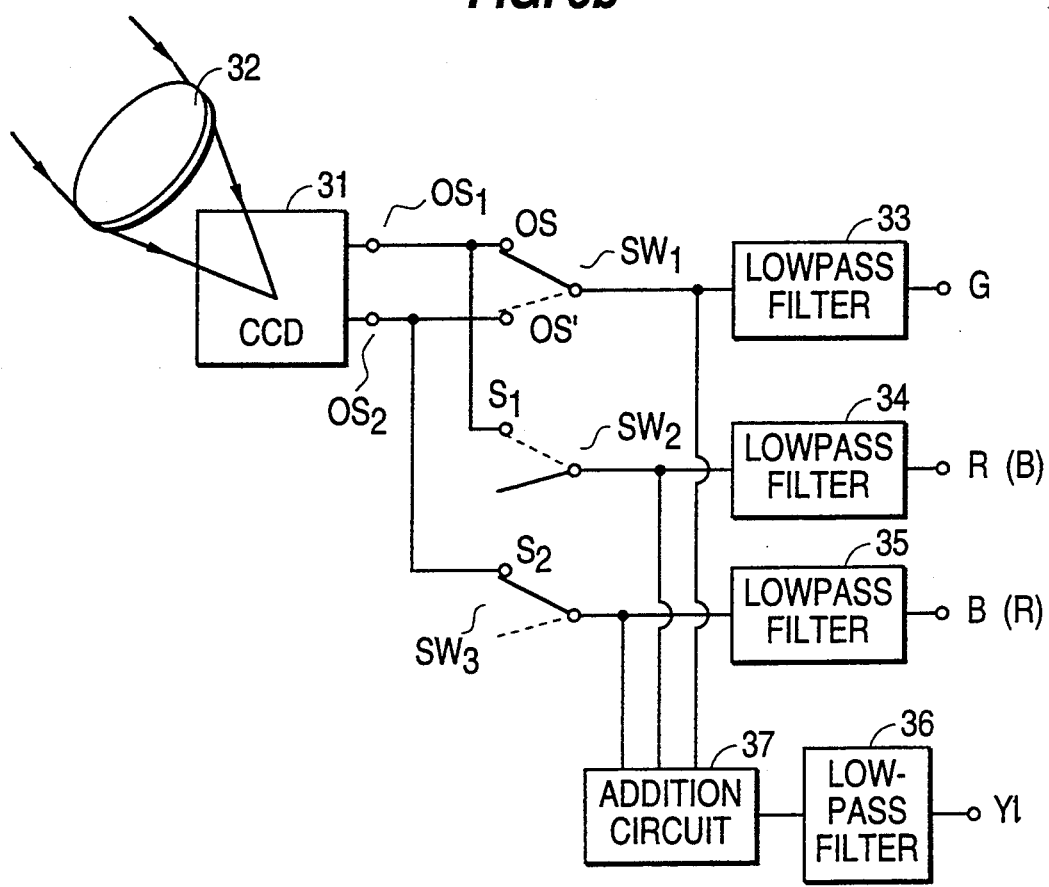
FIG. 3b shows a color signal separation circuit for separating the color signals.

FIG. 3b shows an example of a color signal separator to separate the output into color signals. The color signal separator comprises switches SW1, SW2 and SW3, low pass filters 33 to 36 and an addition circuit 37. Also shown are the solid state image sensor chip 31 and a lens system 32. At the timing when the color signals of G and B are read out from the output terminals OS1, OS2 the switch SW1 shifts to the OS side and switch SW2 turns on to get R and B signals. At this timing, the switch SW3 is off. Thus, the G, B and R signal patterns are obtained from the output terminals. The luminance signal Ye is formed by adding these color signals in the adding circuit 26 based on the relation $Ye=2G+\frac{1}{2}(B+R)$ by using $2\times 2$ color filters as the basic unit. Also, it is understood the minimum unit of the color filters consists of only $2\times 2$ color filters. Accordingly, the color signals for 256 horizontal scanning lines are output in one field.

The description above only concerns the readout cycle of the signal charges integrated in the photosensing region during the first field period tF1 and then read out from the chip during the second field period tF2. Therefore, the next readout cycle is described hereinafter referring to FIG. 2b again.

The next signal charges stored during the integrating period tBE are loaded to the second V CCds A, B in the vertical blanking period tBB of the second field period tF2. That is, at first, a field shift pulse $\phi\phi FS2$ is applied to the terminal $\phi I1$ to read out the signal charges from photodiodes to the first V CCDs, then, are transferred to the second V CCDs A by applying four phase clock pulses to the first V CCDs (2-1, 2-2, —, 2-M) and to the second V CCDs A (5-A1, 5-A2, —, 5-AM). The four phase clock pulses supplied at this timing are illustrated in FIG. 2b, for example, as pulses $\phi IT3$, $\phi IT7$ and $\phi ST2$. Then, the remaining signal charges are read out from the photodiodes (1-2, 1-4, —) to the first V CCDs (2-1, 2-2, —, 2-M) by applying a field shift pulse FS4. Then, the signal charges are loaded to the second V CCDs B (5-B1, 5-B2, —, 5-BM) by applying four phase clock pulses to the first V CCDs (2-1, 2-2, —, 2-M) and the second V CCDs B (5-B1, 5-B2, —, 5-BM). The pulses applied at this timing are denoted as $\phi IT4$, $\phi IT8$ and $\phi ST4$. The transfer direction per se is the same as that of the previous cycle. However, at first, the signal charges corresponding to the first horizontal row in the photodiodes array are swept out from the chip through H CCD 7A. Then, the same readout cycle aforementioned is performed, during the third field period, until all of the signal charges in the temporary storage region 4 are read out from the chip. Accordingly, from the output terminals OS1 and OS2, signal charges shifted one pitch below in the photodiode array, are respectively read out. Thus at the timing where the color signals B and G are read out from the output terminals OS1 and OS2, the switch SW1 turns to OS' and the switch SW2 turns on to get G and B signals, respectively. At this point in time, the switch SW3 is turned off. On the other hand, at the timing when the color signals G and R are read out from the output terminals OS1 and OS2, the switch SW1 turns to the 0S side and the switch SW3 turns on to get G and R signals. In this instance, the switch SW2 is turned off.

In the above-described embodiment, the interlaced scanning of the 512 horizontal scanning lines of the TV is thus executed.

According to the present embodiment, the minimum unit of the color filter arrangement is small, being $2\times 2$ color filters in size. Therefore, the resolution is extremely improved. And the fine pitch of each color filter effectively lessens the moire effect and the appearance of dummy signals on the TV.

Figure 4A:
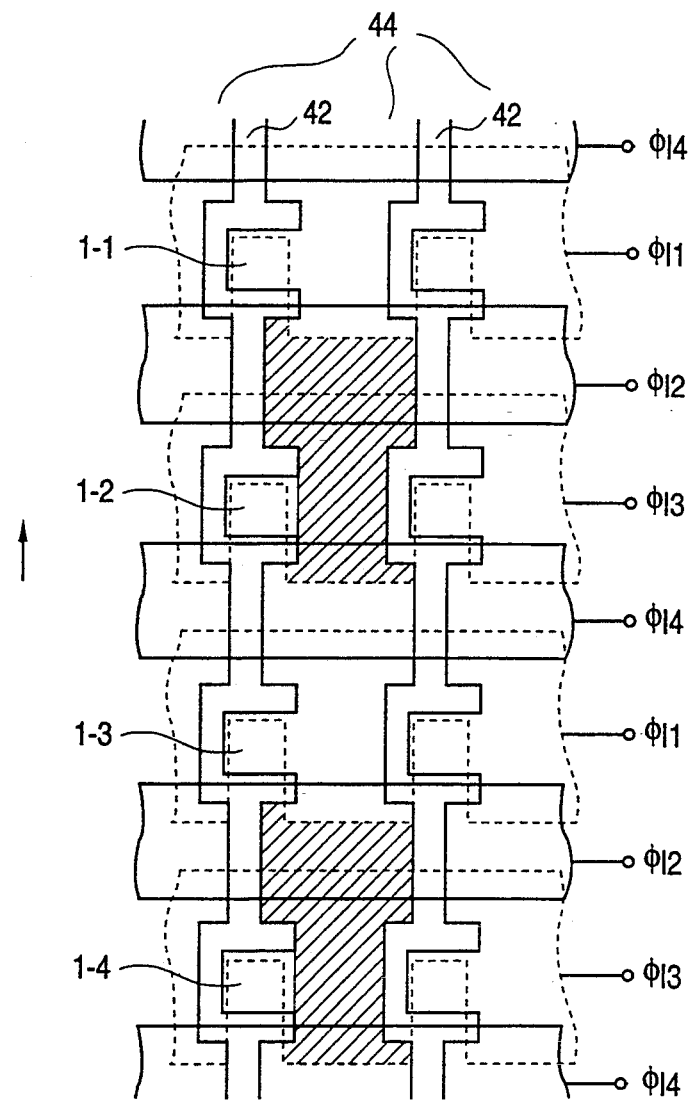

FIG. 4A shows a partial plan view of the configuration and structure of the photosensing region.

On the semiconductor substrate, there are formed channel stopper regions 42 and channel regions 44 of the first V CCDs. And on the substrate, transfer electrodes with two layers are arranged in the horizontal direction. To these electrodes, the four phase clock pulse is supplied. The broken lines represent the first-layer polysilicon and the solid lines represent the second-layer polysilicon.

Figure 4B:
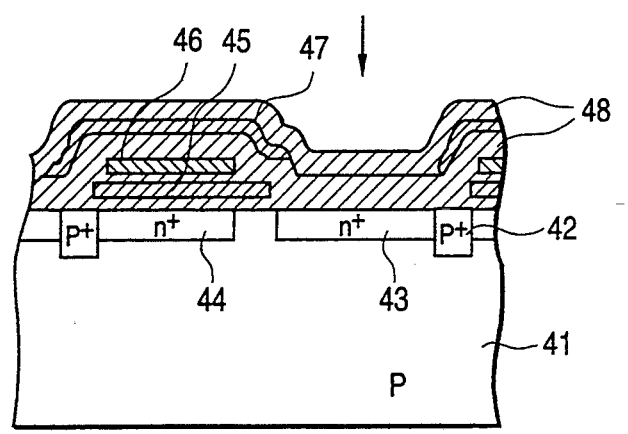
Figure 4C:
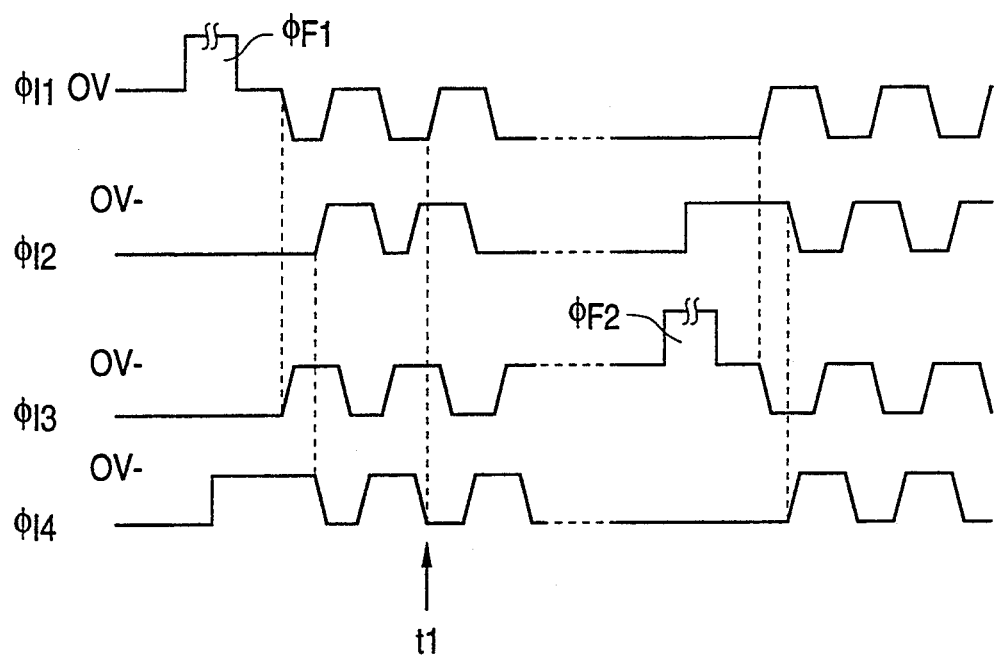

A cross sectional view is shown in FIG. 4b. On a p-type silicon substrate 41, p-type channel stoppers 42, photodiode 43 and n-type channels 44 of the first V CCD are formed. 45 and 46 are the double-layer transfer electrodes, and an AL layer 47 for light-shielding is formed in insulating layers 48. FIG. 4c shows the clock pulses for reading out the signal charges from photodiodes and transferring them to the first V CCds. These waveforms correspond to the frame integration type.

When the field shift pulse $\phi F1$ is applied to the terminal $\phi I1$, the signal charges are read out from the photodiodes (1-1, 1-3). The signal charges are then transferred by the four phase clocks. On the other hand, when the field shift pulse $\phi F2$ is applied to the terminal $\phi I3$, the signal charges are read out from the remaining photodiodes (1-2, 1-4), and then, are transferred according to the four phase clock pulses. The hatched area in FIG. 4a means the signal charges transferring at time t1.

Figure 5A:
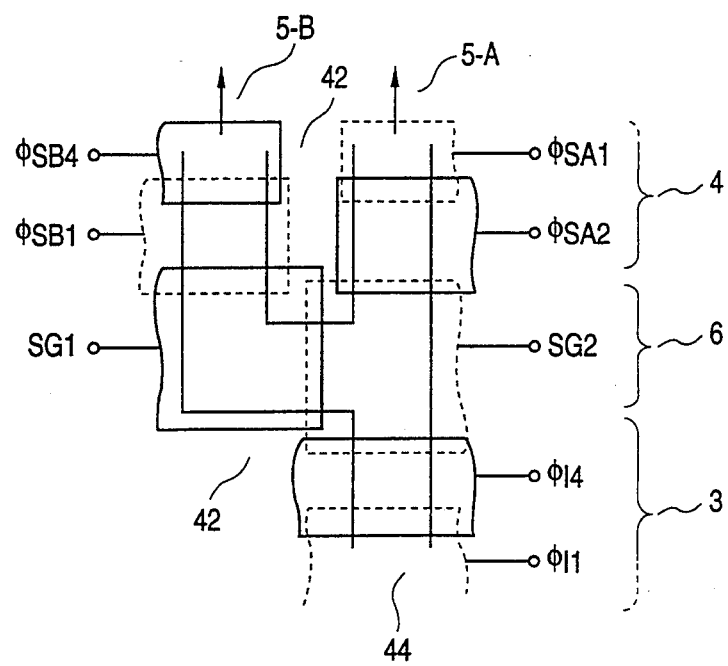
FIG. 5a is an illustration of a partial plan view of the switch means disposed between a vertical CCD in the photosensing region and the vertical CCDs in the temporary storage region.

FIG. 5a shows the structure of the connecting portion between the first V CCD and the second V CCDs A and B, together with the switching gates. The broken lines indicate the first-layer polysilicon, and the solid lines indicate the second-layer polysilicon.

Figure 5B:
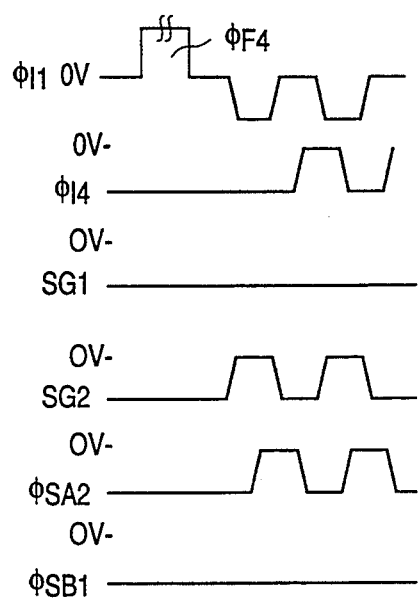
Figure 5C:
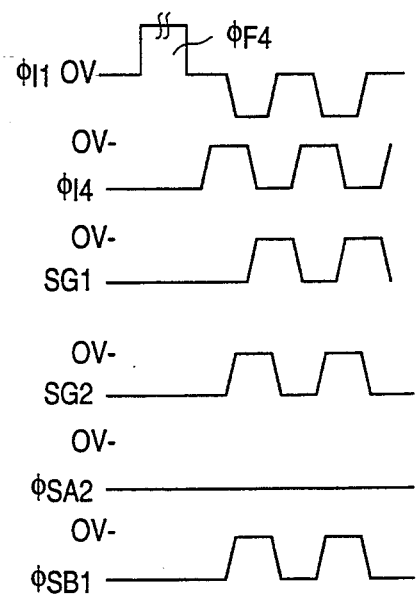

FIG. 5b shows the clock pulses for realizing the transfer of the signal charges from the first V CCDs to the second V CCDs A. On the other hand, FIG. 5c shows the case where the signal charges are transferred from the first V CCDs to the second V CCDs B. Of these figures, as its representative of the field shift pulses, $\phi F4$ is shown. In the period to transfer signal charges from the first V CCDs to the second V CCDs A or B, the gates SG1, or SG1 and SG2 act as CCDs, by applying four phase clock pulses to the terminals φIL to φI4, SG1, (SG2) and φSA1 to φSA4 (or φSB1 to φSB4). The second V CCDs A and B are so designed as to be driven independently. In FIG. 4a, although only several transfer electrodes of the first and second V CCDs are shown, these electrodes keep the arrangement order of:

φI1–φI2–φI3–φI4,
φSA1–φSA2–φSA3–φSA4 or
φSB1–SB2–φSB3–φSB4, respectively.

In this embodiment, the transfer electrodes belonging to the parallel second V CCDs are electrically connected in common with respect to each of the groups A and B, for example, by aluminum interconnections (not shown). The same thing is true for the gates SG1 and SG2.

EXAMPLE 2

Figure 1:
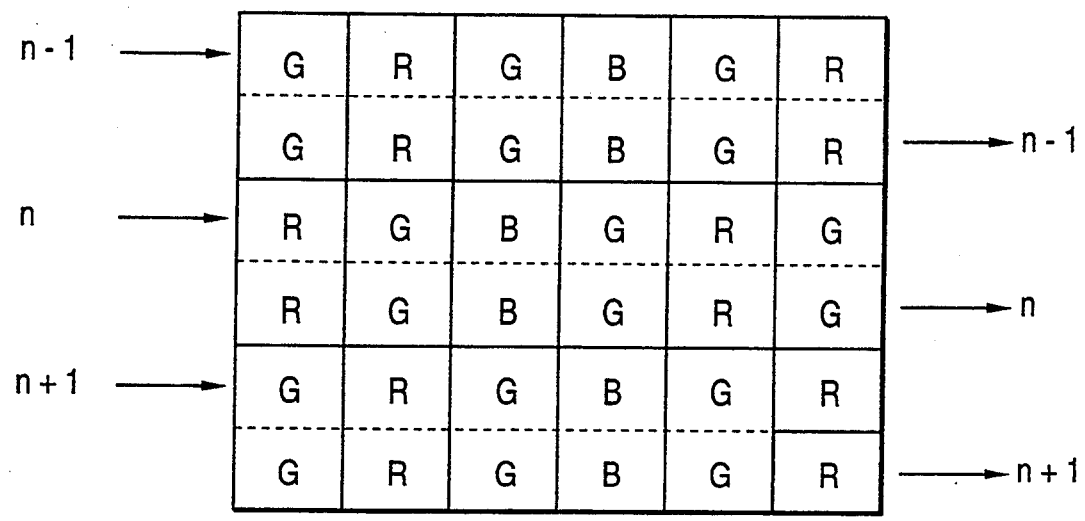
FIG. 1 illustrates a color filter arrangement formed on a conventional solid state image sensor.
Figure 6B:
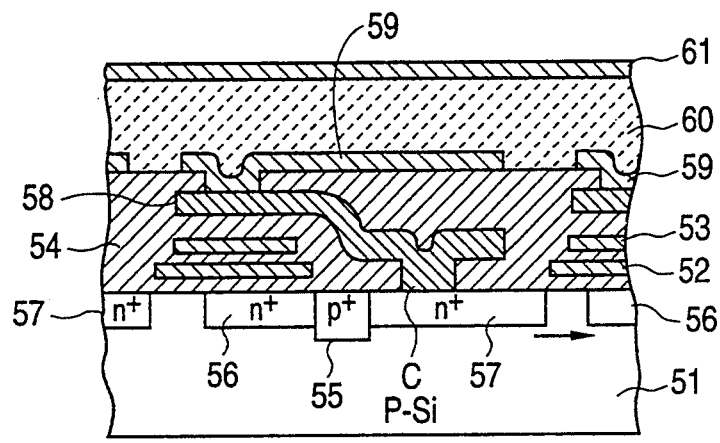
Figure 6A:
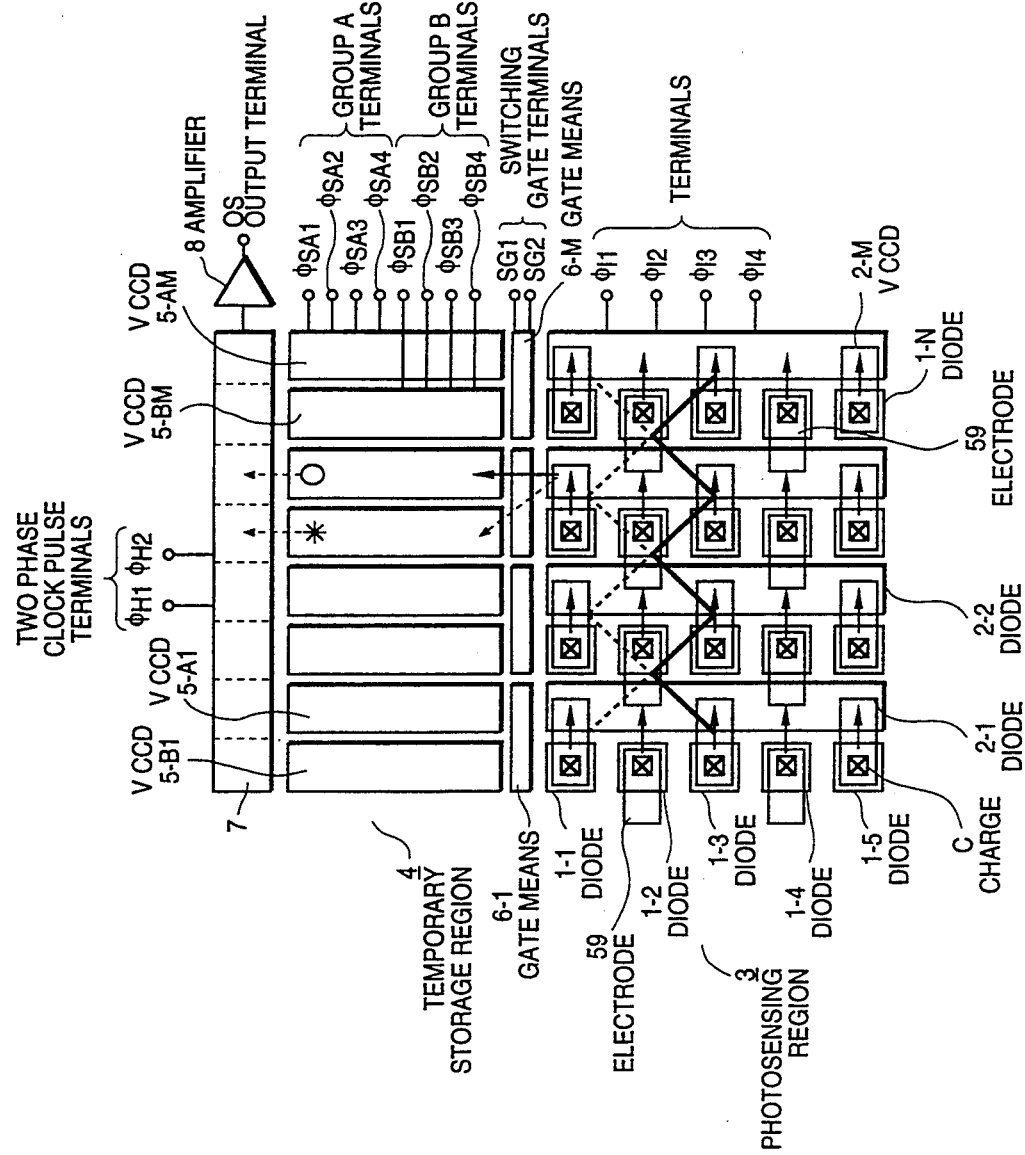
FIG. 6a shows a plan view of the solid state image sensor of a second embodiment of the present invention, which has a zig-zag arrangement of picture element electrodes.

FIG. 6a illustrates the layout of the solid state image sensor chip of this embodiment, and FIG. 6b shows the enlarged cross sectional view of the photosensing region.

This embodiment may be applied to a black and white solid state image sensor useful for an industrial TV camera and so forth. The layout is similar to that of Example 1, except that the H CCD 7 is a one line type. The photosensing region of the chip has a stacked structure. Also, the picture element electrodes 59 connected to the diodes (1-1, 1-2, —, 1-N) are shifted at their central points in the horizontal direction along every other row of the diode array in order to produce different sampling points.

In FIG. 6b, on a P-type Si substrate 51, there are formed double-layer transfer electrodes 52, 53 of the first V CCDs in an insulating layer 54. Outlined by channel stopper 55, N-type channels 56 of the first V CCDs and the diodes 57 are formed at the surface of the substrate. To these diodes 57, an Al electrode 58 is connected through a contact hole. Further, at the surface of the insulating layer 54, picture element electrodes 59 are formed contacting the Al electrodes 58 through contact holes. Onto the structure, a photoconductive layer 60 such as amorphous silicon and a transparent electrode 61 are stacked.

The operation of this chip is as follows. The operation itself is the same as described in Example 1. In the first field, the signal charges of the odd number rows of the diode array are read out from the diodes to the second V CCDs A through the first V CCDs and the gate 6 (solid lines), then in the same field period, the remaining signal charges of the even number rows of the diode array are read out to the second V CCDs B (broken lines.) The signal charges loaded into the temporary storage region 4 are successively read out from the H CCD 7 row-by-row, by repeating the cycle comprising receiving signal charges from the second V CCDs A and B then transferring them out. This read out cycle from the chip is carried out in the next field period the same as in Example 1. The locus of the signal charges in the photosensing region is a zig-zag pattern indicated as a dot-solid line FIG. 6a. In this instance, the center line of the zig-zag locus corresponds to the horizontal scanning line on the TV. Before performing the next read out cycle from the chip, the signal charges positioned at the first horizontal row of diode array are swept out from the chip through H CCD 7. Therefore, the signal charges of second and third rows of the photodiode array are loaded into the corresponding transfer stages of the H CCD 7. Then the readout cycle synchronized with the horizontal scanning lines starts. One of the locuses of the signal charges read out from the chip in the third field period is illustrated by a solid line in FIG. 6a. Thus, the interlaced scanning on the TV is completed.

According to this embodiment, a reproduced image having highly improved horizontal resolution can be obtained, based on the periodic shifting of the central position of the picture element electrodes 59.

A rhomb or any other appropriate configuration may be adopted as the planetary shape of the picture element electrodes 59 instead of a rectangle.

EXAMPLE 3

FIG. 7 shows an example of a solid state image sensor adaptable for an electronic camera. FIG. 7a is a drawing of the layout, and FIG. 7b showing timing pulses to be applied.

The electronic camera is an apparatus to take a static reproduced image from an incident light image, and can be used instead of a still camera. The basic structure is the same as the solid state image sensor described in the Example 1. However, this embodiment adopts field integration type operation. The picture is taken in one field. Thus, the device is also adaptable for OCR use and the like. On the substrate of the solid state image sensor chip, a drain 70 and a plurality of drain gates 71-1, 71-2, —, 71-M are formed. The drain 70 is an N-type region formed at the surface of the P-type substrate, and is reverse-biased to the substrate. The charges in the first V CCDs can be swept from the drain region 70 through these drain gates 71-1 to 71-M. Usually, to the drain 60, a plus potential is applied.

The operation is described, referring to FIG. 7b. FIG. 7b shows the clock pulses applied to the terminals φI1, φSA1 and φSB1 as representative. After pushing the shutter by the photographer at the timing t0, all the signal charges integrated in the photodiode array (1-1, 1-2, —, 1-N) are swept out from the chip. In detail, the field shift pulses are applied to the first V CCDs (2-1, 2-2, —, 2-M) in response to the shutter to load the whole signal charges into the first V CCDs 2-1 to 2-M, then, the signal charges are swept out to the drain 70 by applying the four phase clock pulses to the first V CCDs. At this time, the drain gates (71-1, 71-2, —, 71-M) are turned on. The clock pulses to the first V CCDs and one of the field shift pulses are indicated in FIG. 7b as numerals φFS11 and φIT9, respectively. Two of four phase clock pulses act as the field shift pulses. The details will be described later using a clock chart of the field integration type. At the same time, the remaining signal charges in the temporary storage region 4 are swept out from the chip by applying four phase clock pulses to the second V CCDs A and B. Numerals φST5 and dST6 correspond to the clock pulses. The remaining charges are swept out through the H CCD 7. The integration of the actual signal charges starts at the timing when the field shift is done (φFS11). The signal charges are integrated in the predetermined period tA. At the end of tA, field shift pulses are applied to the first V CCDs (2-1, 2-2, —, 2-M) to read out the whole signal charges to the first V CCDs. One of the field shift pulses is shown in FIG. 6b as φFS12. Based on the field integration operation, the signal charges are combined in the first V CCDs, between adjoining pairs of photodiodes. In FIG. 7a, the pairs are indicated by solid lines. Continuously, the combined signal charges in the first V CCDs are then transferred to the second V CCDs A (5-A1, 5-A2, —, 5-AM) by applying four phase clock pulses to the terminals φI1 to φI4 and φSA1 to φSA4 through gate means 6-1 to 6-M. The clocks φIT10 and φST7 correspond to the pulses.

Then, the signal charges integrated during the next period tB having the same length of period as that of tA, are read out from all the photodiodes to the first V CCDs, synchronized with the field shift pulses one of which is indicated as φFS13 in FIG. 6b. The signal charges are combined in the first V CCDs. The combination is shifted down (in the drawing) by one cell pitch of the photodiode array. Then, the signal charges are transferred to the second V CCDs B (5-B1, 5-B2, —, 5-BM) by applying four phase clock pulses to the first V CCDs and the second V CCDs B (5-B1, 5-B2, —, 5-BM) (φIT11, φSTS). The signal charges stored in the temporary storage region 4 are then read out from the chip through the H CCD 7. The H CCD 7 is a two lines type in the present embodiment. Thus, the signal charges positioned at the top row of each second V CCD A are loaded to the H CCD 7A and ones positioned at the top row of each second V CCD B are loaded to the H CCD 7B, and then, the H CCDs 7A and 7B transfer them out at the same time. After reading out the signal charges corresponding to the photodiode pairs positioned at the first to third horizontal rows in the photodiode array, the ones positioned at the third to fifth horizontal rows in the photodiode array are read out. This read out cycle continues until all signal charges are read out from the temporary storage region 4. The clock pulses φSL9 to φSL14 correspond to the pulses for loading the signal charges into the H CCD 7A and 7B, horizontal row-by-row of the second V CCDs A and B.

In the solid state image sensor thus fabricated, the shutter speed is defined as the period tS which has a period two times the integration period tA or tB. Since all of the signal charges involving two different sampling modes can be read out from the photosensing region in a short time, according to the present embodiment, a high resolution image and a high speed shutter can be obtained. It is possible to adjust to a desired shutter speed by changing the period tS.

Figure 8B:
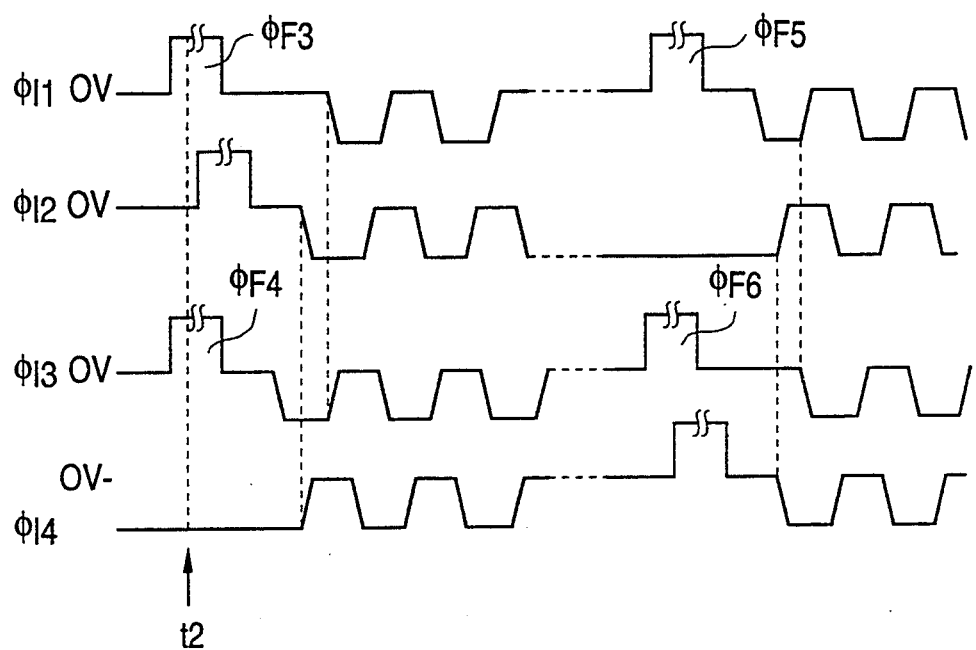
Figure 8A:
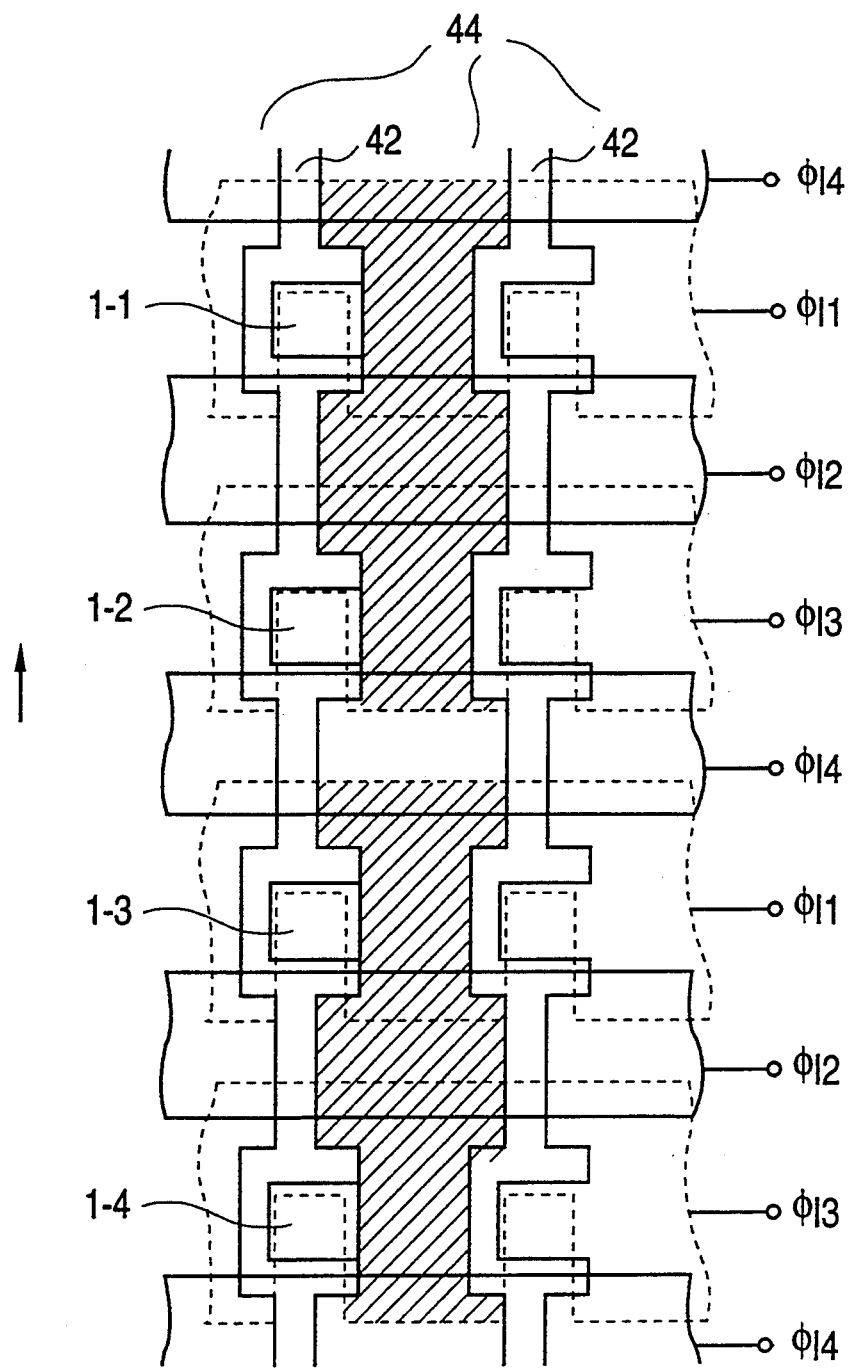
FIG. 8a is an illustration of a photosensing region of the field integration type.

FIG. 8a is a partial plan view of the photosensing region. This is the same illustration as in FIG. 4a. The configuration and structure of the photosensing region of the field integration type is not changed compared to that of frame integration type. However, the hatched area shows signal charge regions which have just been read out from the photodiodes at the timing t2 of FIG. 8b.

FIG. 8b shows the clock pulses for reading out the signal charges from the photodiodes and transferring them into the first V CCDs. This figure corresponds to FIG. 4c. In FIG. 8b, when the field shift pulses φF3 and φF4 are applied to the terminals φI1 and φI3 together with φI2 being at a high level, the signal charges integrated in the photodiodes are read out and added. Then, the signal charges are transferred along the first V CCD. After that, the field shift pulses φF5 and φF6 are applied to the terminals φI1 and φI3 together with a high level potential of φI4, and the signal charges of different combination are attained. And then, the signal charges read out are transferred into the first V CCDs.

FIGS. 5a to 5c are common also in the present embodiment.

EXAMPLE 4

Figure 9:
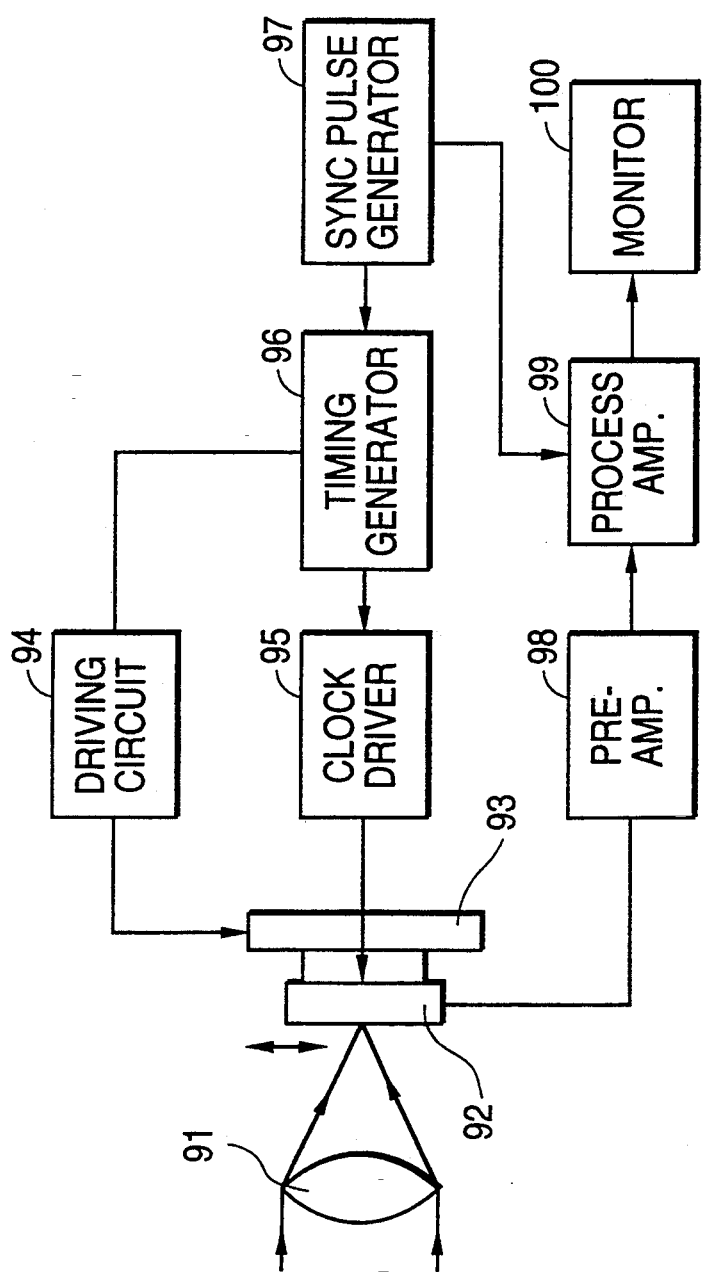
FIG. 9 is a block diagram of a fourth embodiment of the present invention adapted for use in a synchrovision TV system.

This embodiment is of a synchrovision type solid state image sensor. FIG. 9 illustrates a block diagram of a synchrovision TV system. A lens system 91 focuses an incident image onto the front surface of a solid state image sensor chip 92. The chip 92 is mounted on a piezoelectric bimorph deflector 93, and the chip 92 swings or vibrates dependent on the amplitude of the driving pulses to the deflector 93. Therefore, the chip 92 moves relative to the incident light image. The vibrating pulses are generated in a driving circuit 94, and the clock pulses for the sensor chip 92 are supplied from a clock driver 95 with the aid of a timing generator 96. A sync pulse generator 97 generates vertical and horizontal sync pulses and blanking pulses. The output signals are input to a pre-amplifier 98, and then, are supplied to the process amplifier 99. After processing the output signals, the image is reproduced, for example, on a monitor 100.

Figure 10:
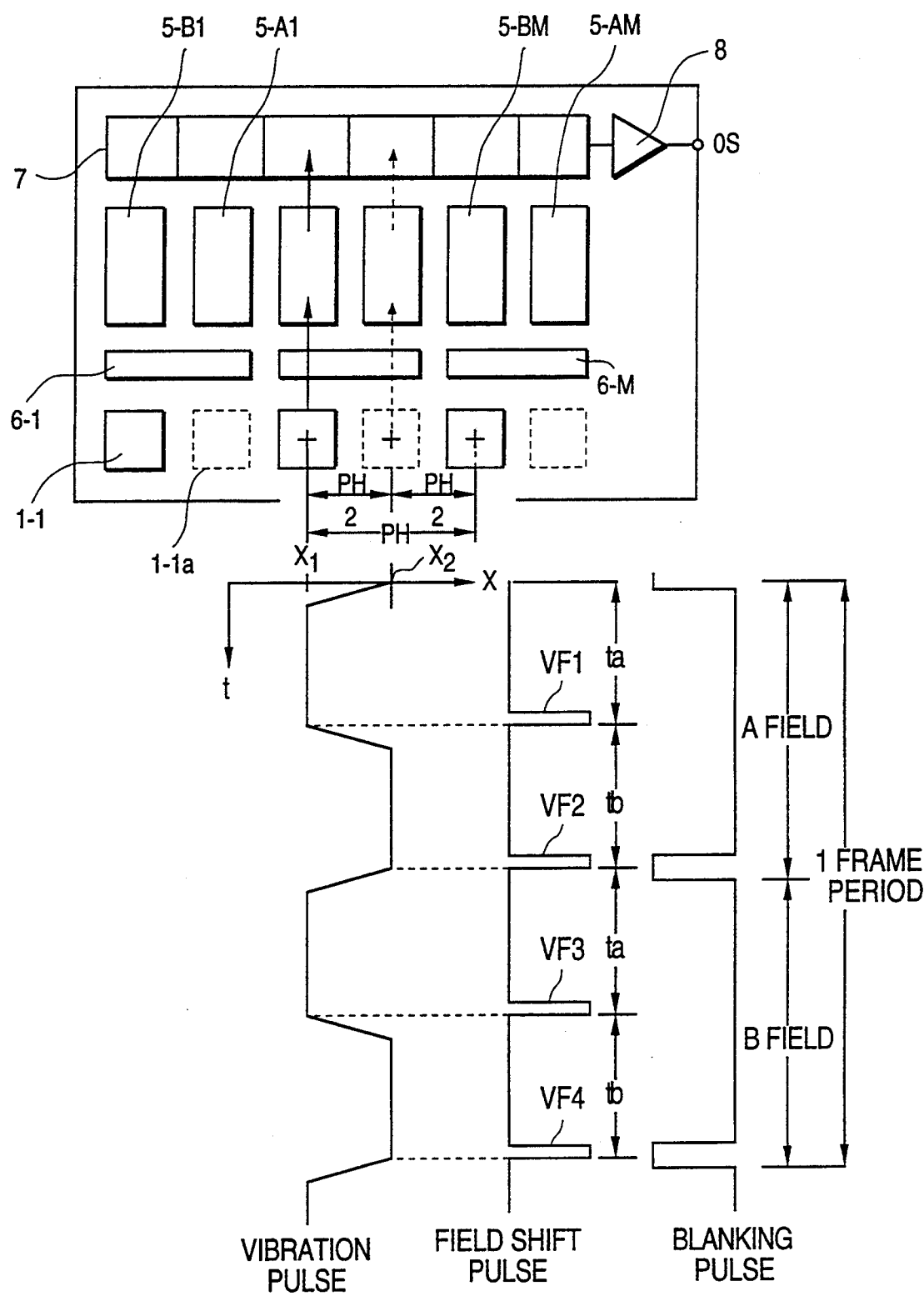
FIG. 10 is an illustration of a model showing the basic operation of a synchrovision solid state image sensor of the fourth embodiment.
Figure 11A:
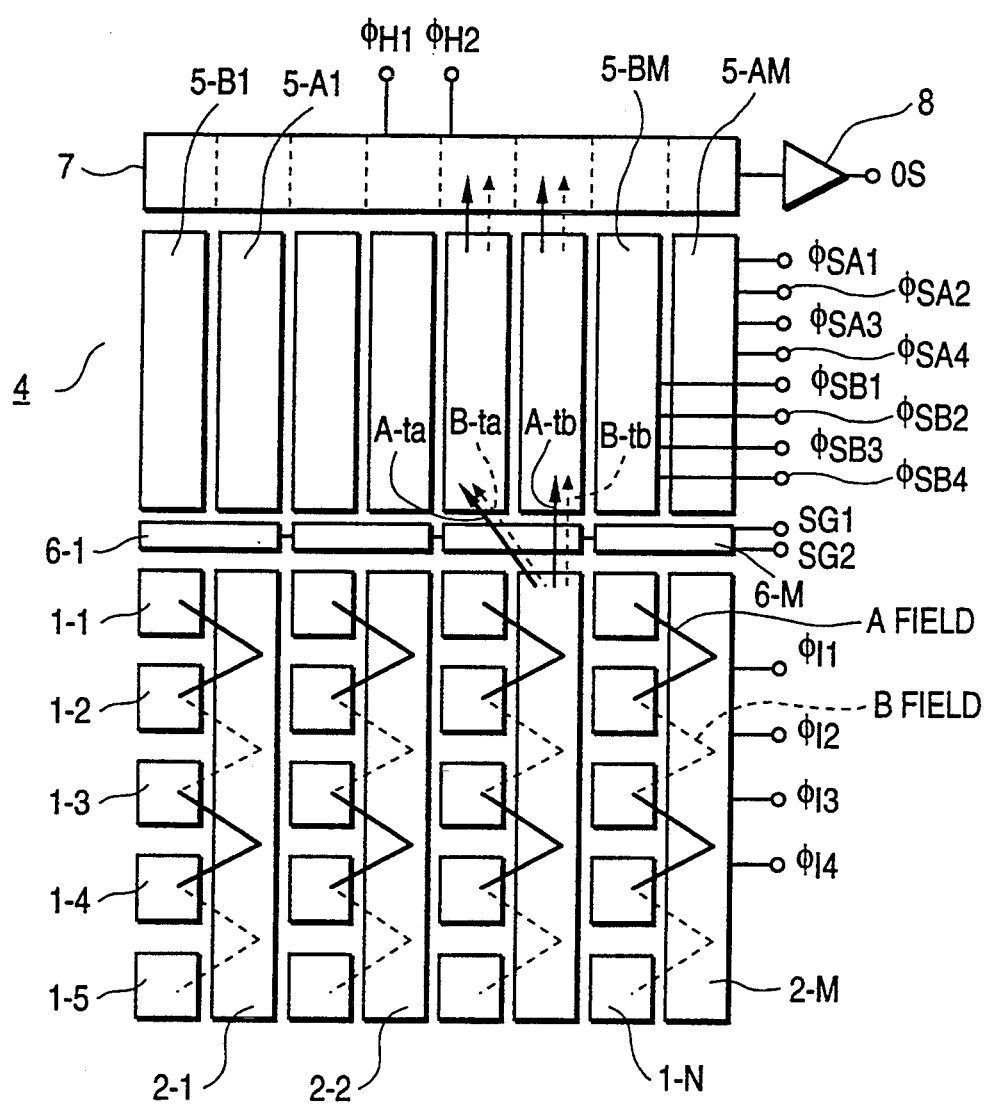
FIG. 11a shows a plan view of the synchrovision solid state image sensor of FIG. 9.

FIG. 10 is a model illustrating the relationship of the positions of the photodiodes to the vibration pulse, field shift pulse and blanking pulse. The region 1-1 shows the original site of a photodiode (solid line); on the other hand, the region 1-1a (broken line) shows a swung position. The amplitude of the movement in the horizontal direction is set at (½)Ph, which equals one-half of the photodiode pitch (Ph) in the same direction. One cycle of the vibration coincides with one field, and the midpoint of the vibration is about at the ½ field point. The vibration pulse is synchronized with vertical blanking pulses that define A, B fields constituting one frame period. The field shift pulse which read out the signal charges from the photodiodes is adjusted to the vertical blanking pulse on the TV. This chip is operated in a field integration mode. Signal charges are read out from photodiodes at a timing near the center of the A field with first field shift pulse VF1 (original site), and then, the next signal charges are read out from photodiodes at the end of the A field with the second field shift pulse VF2 (new site). Then, in the B field, by changing the combination of the vertical pairs, signal charges are read out from the photodiodes by a third field shift pulse VF3 (original site). Then, the signal charges of the photodiodes are read out from the photodiodes by a fourth field shift pulse VF4 (new site). This is the operation to complete one frame period. In this instance, the information from two image sampling points are read out from the chip in one field. That is, in the period tA, photodiodes are positioned at X1, and in the period tB the photodiodes are positioned at X2. Similarly, in the period tB of the B field, the photodiodes are positioned at X1, and in the period tB, the photodiodes are positioned at X2. FIG. 11a illustrates the detailed layout of the synchrovision solid state image sensor. FIG. 10b shows clock pulses applied to the chip.

Figure 11B:
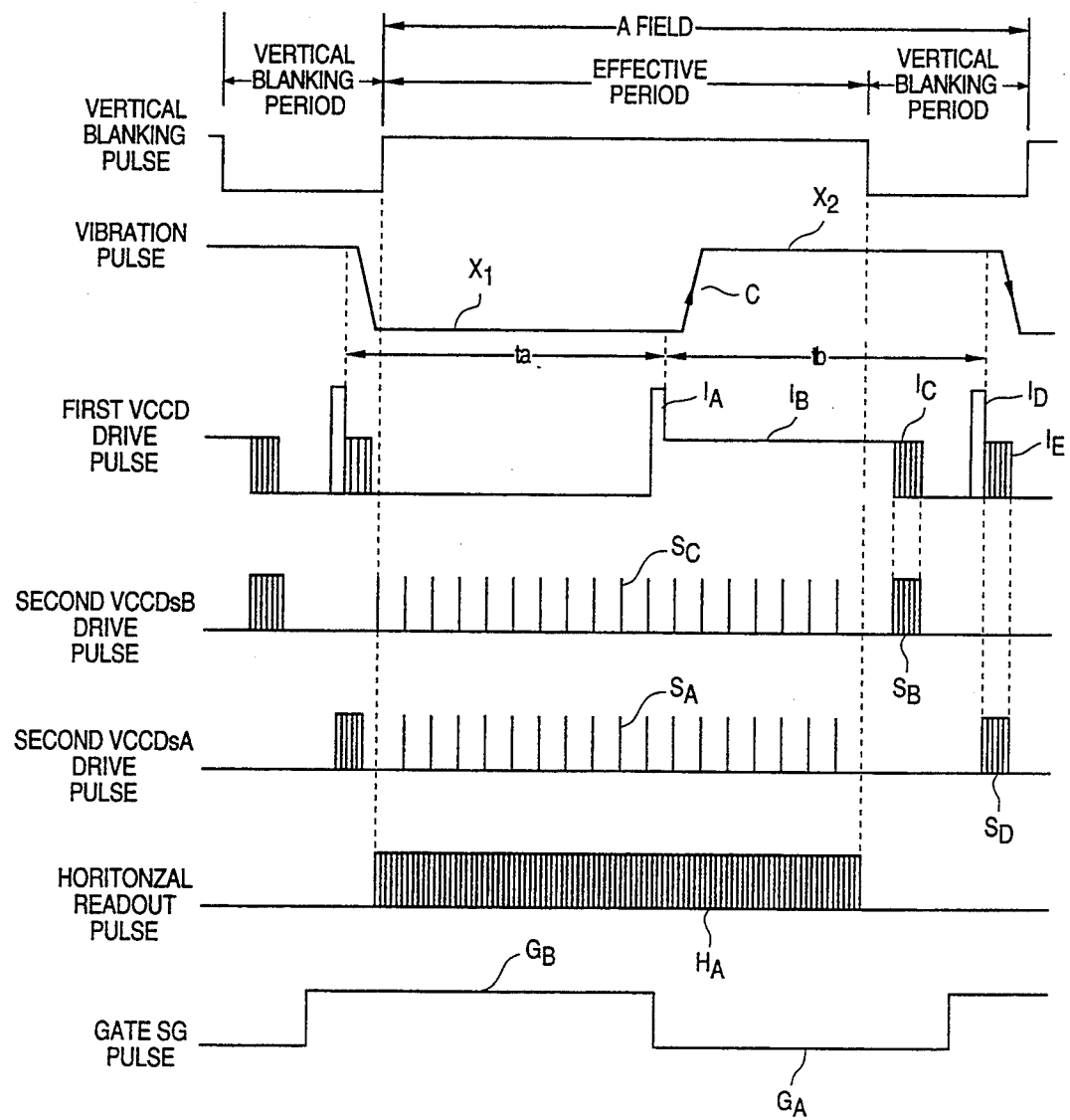

Signal charges are integrated in the photodiodes (1-1, 1-2, —, 1-N) in the period a of A field. Just before the vibrating pulse moves from the position X1 (original site) to X2 (new site), namely, before the timing C, a field shift pulse IA is applied to the first V CCDs as shown in FIG. 11b. The signal charges read out at this timing are kept in the first V CCDs (2-1, 2-2, —, 2-M). The potential for this is the level IB. Then, just after the timing that the vertical blanking pulse enters the vertical blanking period of A field, the signal charges stored in the first V CCDs (2-1, 2-2, —, 2-M) are loaded into the second V CCDs B (5-B1, 5-B2, —, 5-BM), by respectively applying four phase clock pulses to the first V CCDs and the second V CCDs B (Ic, Sb). The transferring direction of the gate means (6-1, 6-2, —, 6-M) is indicated as A-ta in FIG. 11a. Then, signal charges integrated in the photodiodes during the period tb (tb is as same length as ta) are read out from the photodiodes by applying field shift pulse ID to the first V CCDs. At this timing the signal charges of pairs are also combined in pairs in the first V CCDs. Immediately, the signal charges are transferred from the first V CCDs to the second V CCDs A (5-A1, 5-A2, —, 5-AM) in the vertical blanking period of the A field with IE and SD. The manner for combining the signal charges is the same as before, and is indicated by solid lines in FIG. 11a as "A field". The signal charges loaded into the temporary storage region 4 are successively read out, horizontal row-by-row, through the H CCD 7.

In the next B field cycle, a similar read out operation is performed. However, the combination in the first V CCDs is shifted one pitch lower.

In detail, the signal charges integrated in the period tb and B field are read out and combined in pairs in the first V CCDs, then are transferred to the second V CCDs A in the vertical blanking period of the B field. The transferring direction for these charges is given as B-ta in FIG. 11a. The signal charges correspond to the position X1 (original state). Then, the signal charges integrated in the photodiodes during the period tb of B field are read out and combined in the first V CCDs, and are immediately transferred to the second V CCDs B in the vertical blanking period of B field. These signal charges correspond to the position X2 (new site), and the transferring direction is shown as B-tb. Then the signal charges are successively read out, horizontal row-by-row, through the H CCD 7. The combination of these signal charges in the photosensing region is indicated by broken lines in FIG. 11a as "B field."

In FIG. 11b, clock pulses for loading (SC, SA), horizontal readout pulses HA and gate SG pulses GA and GB are shown. The gates may have the construction disclosed in FIGS. 5a to 5c.

Figure 11C:
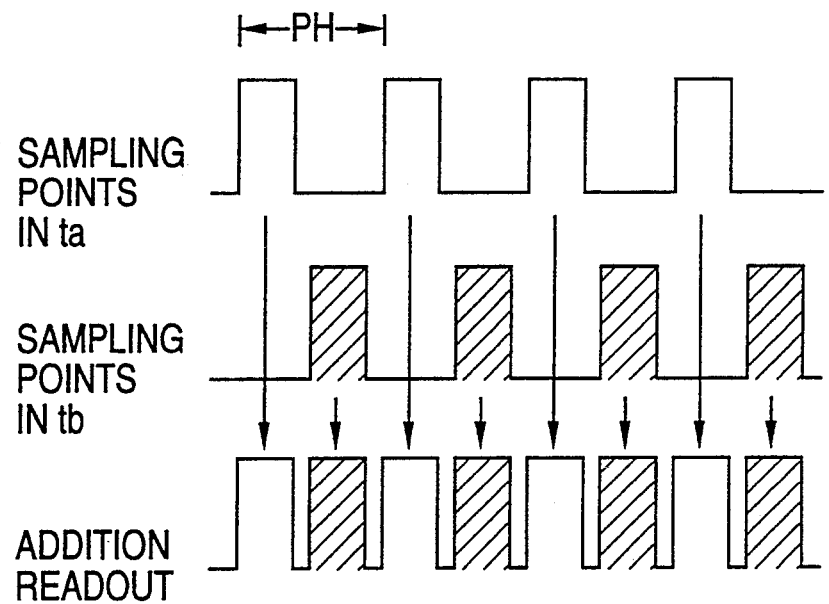

FIG. 11c illustrates the output signal pattern from the output terminal OS. As is seen, the signal charges integrated in the period tA (original state) and the signal charges integrated in the period tB (new site) are inserted in the H CCD 7, and then, are read out sequentially, being synchronized with the horizontal scanning lines.

Figure 11D:
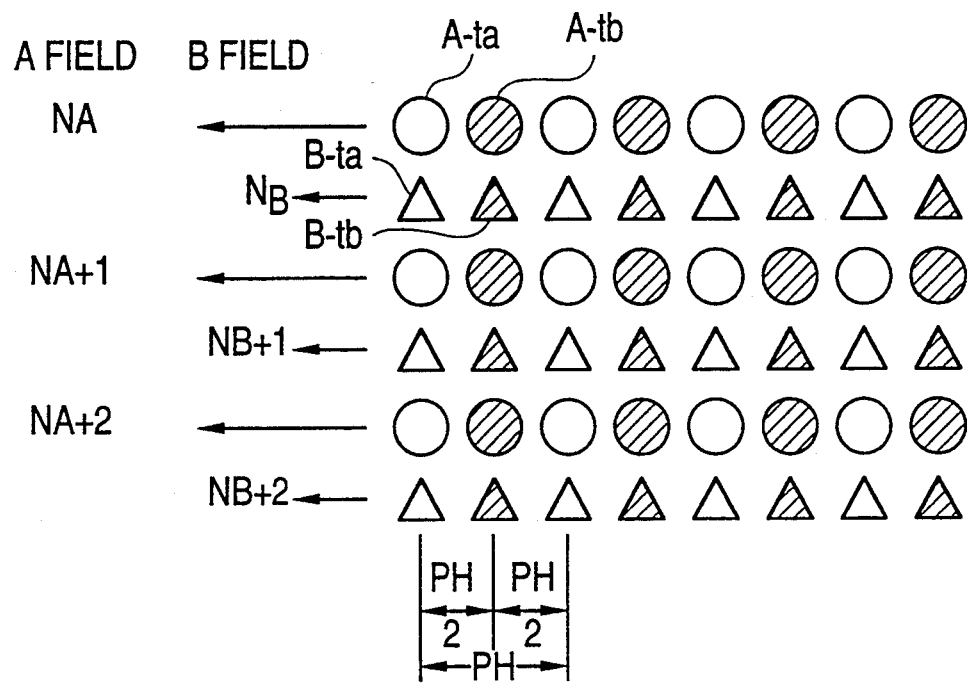

FIG. 11d illustrates a two-dimensional arrangement of the output signal pattern. Between the horizontal rows of A field output pattern NA, NA+1 and NA+2, horizontal rows of B field output pattern NB, NB+1, NB+2 are inserted. In FIG. 11d, a white circle means the signal charge integrated in the period A-ta (effective period ta of A field). Similarly, a hatched circle, white triangle and hatched triangle respectively means A-tb, B-ta and B-tb. The signal lines of A field and ones of B field are output in different periods, thereby achieving interlaced scanning of the horizontal scanning lines of the TV.

The synchrovision camera itself is known, for instance, by U.S. Pat. No. 4,543,601 (Harada et al). However, in the conventional instance, vibration was effected between different fields. On the contrary, according to the present embodiment, high horizontal resolution can be obtained. This is because the location of the photodiodes is horizontally swung in one field. Further, since the horizontal resolution is improved, it is possible to suppress the appearance of moire.

Figure 12:
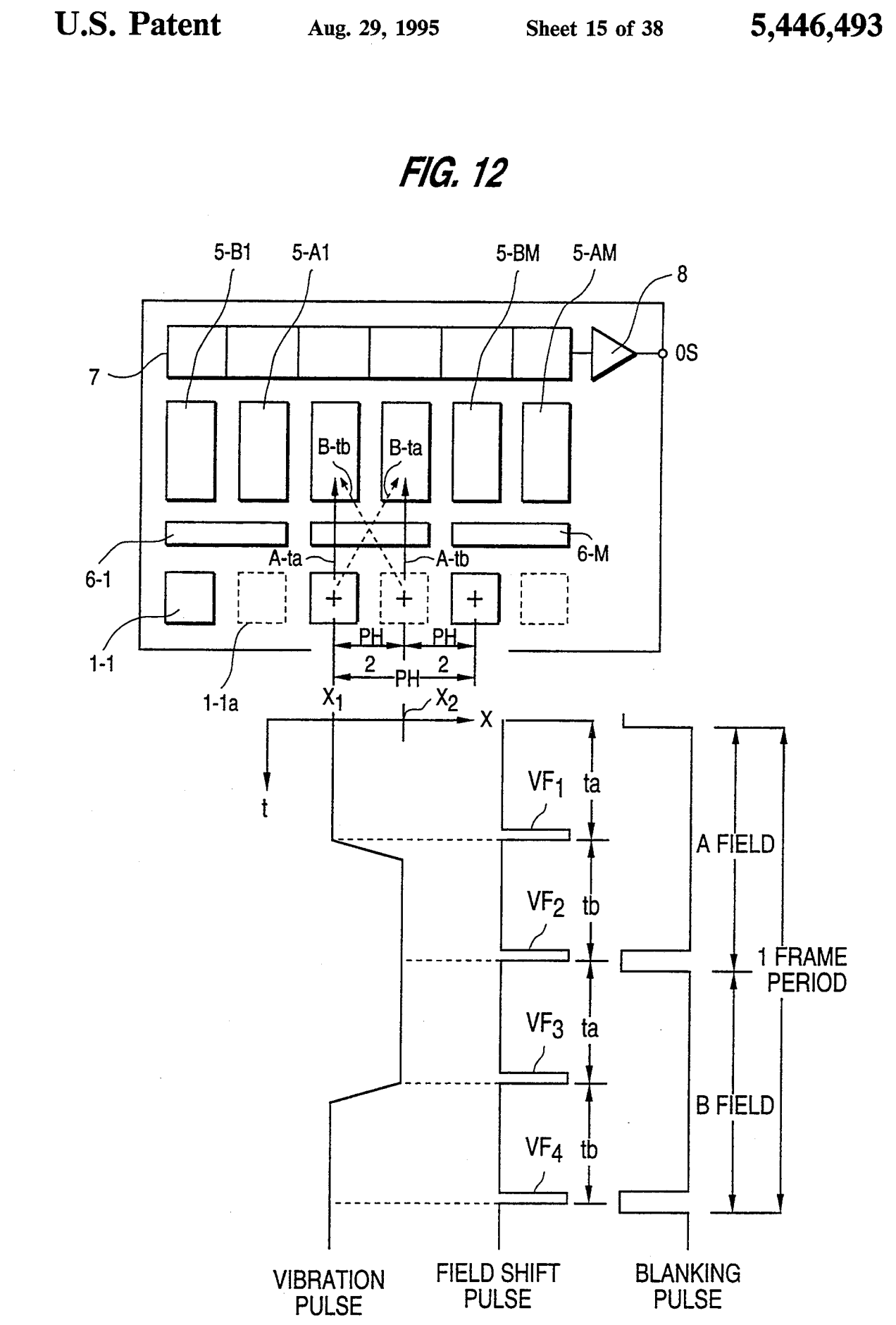

FIG. 12 is a modification showing another type of vibration pulse. In this embodiment, the phase of the vibrating pulse is shifted 180 degrees between A and B fields. And the transferring direction of the signal charges integrated in ta of B field is directed to the second V CCDs A, and that of signal charges integrated in tb of B field is directed to the second V CCDs A.

EXAMPLE 5

Figure 13A:
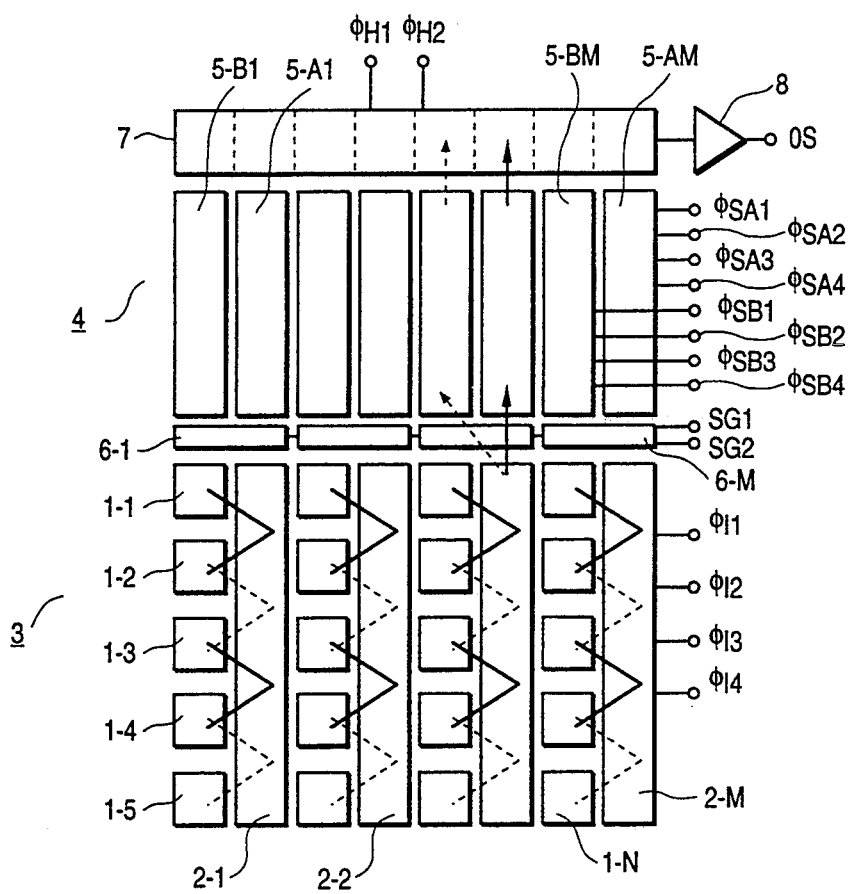
FIG. 13a is a layout of a solid state image sensor of a fifth embodiment of the present invention useful for a non-interlacing system.
Figure 13B:
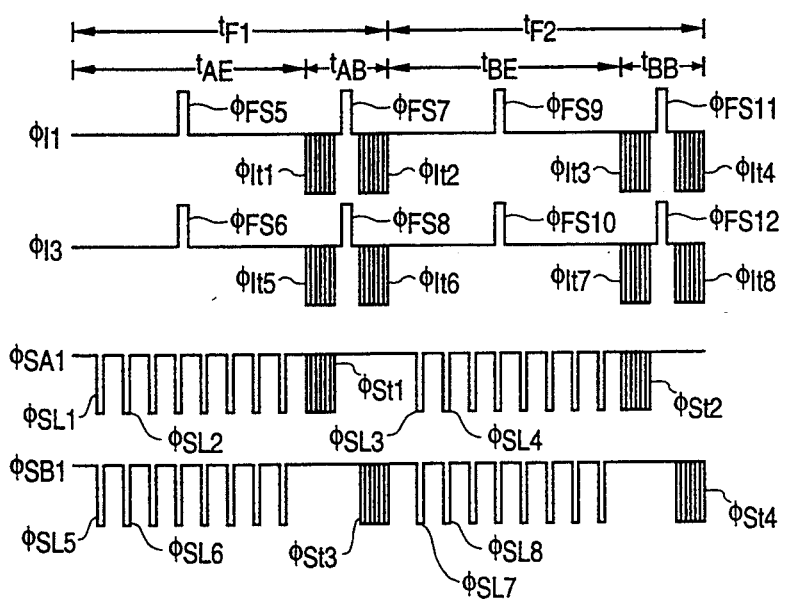

FIG. 13a shows another embodiment of the invention adaptable for the IDTV system, EDTV system and so forth, and FIG. 13b shows the clock pulses applied to the device shown in FIG. 13a.

Signal charges integrated in the photodiodes during the first half of the effective period tAE of the first field tF1 are read out from the photodiodes to the first V CCDs in response to the field shift pulses FS5, FS6, and are combined in pairs (solid line). Then, the signal charges are transferred to the second V CCDs A in the vertical blanking period tAB of the first field by applying four phase clock pulses to the first V CCDs and the second V CCDs A ($\phi$IT1, $\phi$IT5 and $\phi$ST1). On the other hand, the signal charges integrated in the latter half of the effective period tAE are read out from the photodiodes with the field shift pulses $\phi$FS7, $\phi$FSS, and are combined in pairs in the first V CCDs (broken lines). Then, they are immediately transferred to the second V CCDs B in the vertical blanking period tAB of the first field by applying four phase clock pulses to the first V CCDs and the second V CCDs B ($\phi$IT2, $\phi$IT6 and $\phi$ST3). The signal charges loaded into the V CCDs A and B are sequentially read out through H CCD 7 from top to bottom of the temporary storage region 4. The four phase clock pulses applied to the second V CCDs A and B are indicated as $\phi$SL3, $\phi$SL4, $\phi$SL7 and $\phi$SL8. This read out cycle continues until all the signal charges in the temporary storage region 4 are read out from the chip. In the second field tF2, the same operation is performed. That is, signal charges integrated in the first half of the effective period tBE are readout (solid lines) by the field shift pulses $\phi$FS9 and $\phi$FS10, and are transferred to the second V CCDs A in response to four phase clock pulses ($\phi$It1, $\phi$It5). And signal charges integrated in the latter half of the effective period tBE are readout (broken lines) with $\phi$FS11 and $\phi$FS12, and are transferred to the second V CCDs B by applying four phase clock pulses to the first V CCDs and second V CCDs B ($\phi$IT4, $\phi$IT8 and $\phi$ST4). Then, signal charges are readout from the second V CCDs A and B through the H CCD 7 in the same manner as described. In one signal charge row output from the terminal OS, the charges based on different groups in the second V CCDs, namely, groups A and B, are inserted between each other; therefore, the signal charges from the second V CCDs B are then picked-up and delayed out of the chip for 1H, i.e. one horizontal scanning period of the reproduced image. Thus, the signal charge rows obtained from each of the second V CCDs A and B are respectively interlaced in an alternative fashion when seen in a timetable.

This means that, according to this embodiment, high resolution can be achieved because of doubling the number of the horizontal scanning lines. In this embodiment, the same lines are scanned in the next field.

The solid state image sensor chip of the frame integration type described in FIGS. 2a and 2b can be used for the same purpose.

In the embodiment described in FIG. 13, a one line H CCD 7 is used. However, a two line structure may also be used.

Figure 14B:
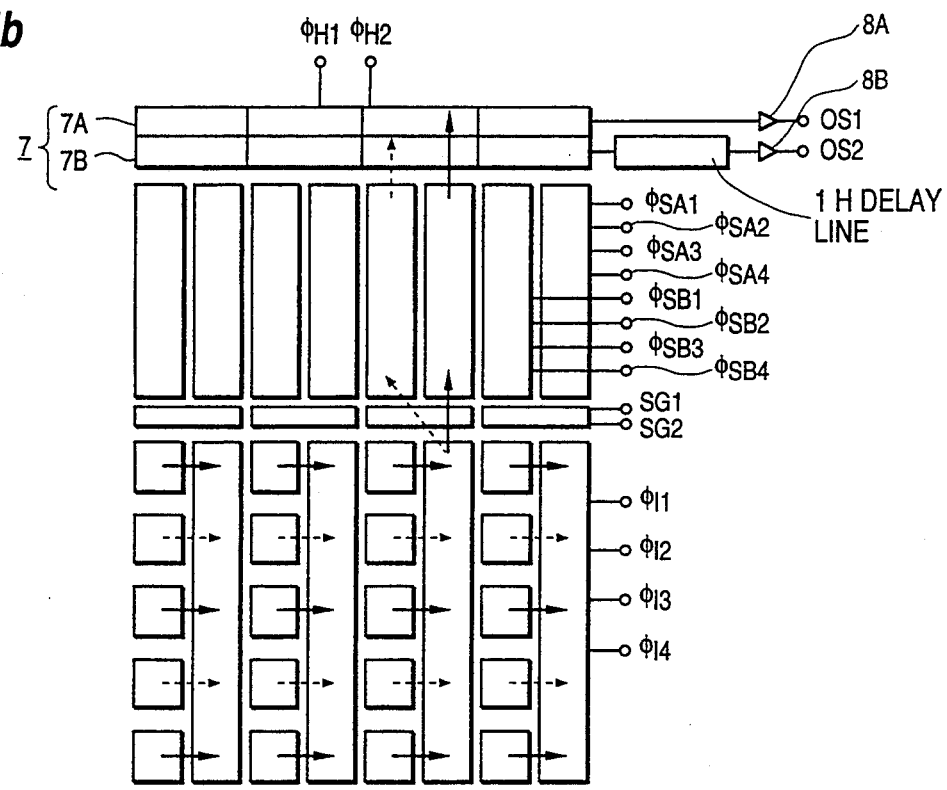
FIGS. 14a and 14b respectively show a 1H delay line formed in a non-interlaced and an interlaced solid state image sensor.
Figure 14A:
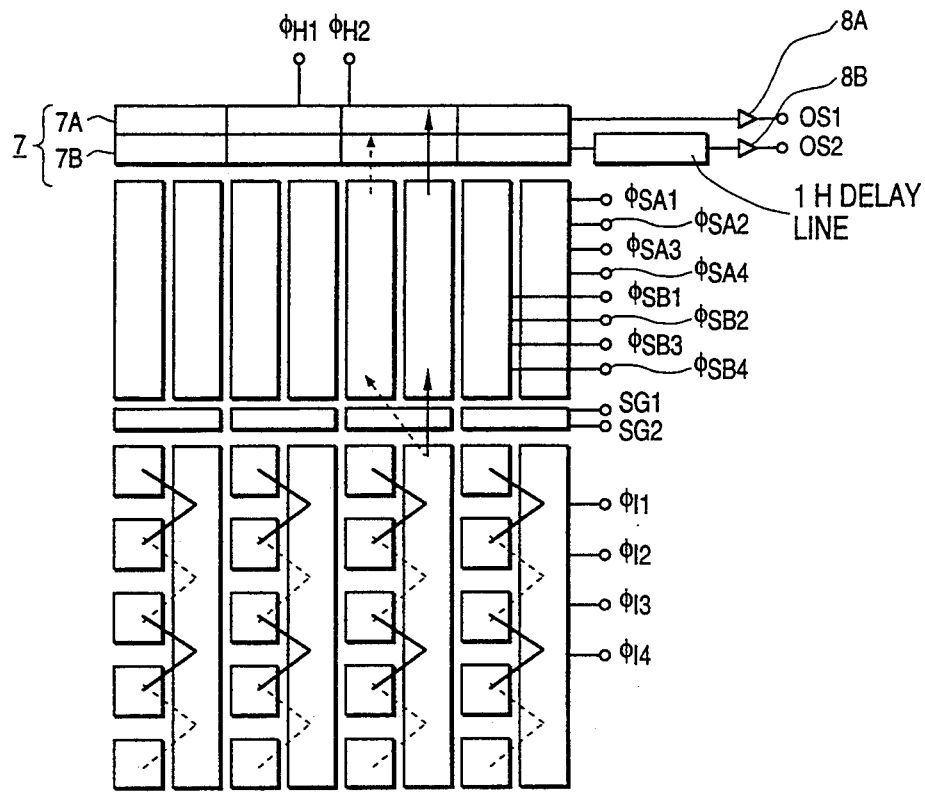

FIG. 14a is a modification of FIG. 13. The chip operates as a field integration type. The H CCD 7 consists of H CCD 7A and 7B, and the signal charge read out from the H CCD 7B is delayed by a 1 H delay line. Therefore, each of the signal charge rows obtained at the output terminal OS2 is respectively inserted in the period no signal charge row arises at the output terminal OS1. Similarly, FIG. 14b is a solid state image sensor chip which is operated in a frame integration mode. A 1 H delay line is inserted between H CCD 7B and the amplifier 8B for the same purpose.

As for the 1H delay line, a CCD shift register or RAM may be adopted. Such devices operate as a FIFO (first in first out) memory.

EXAMPLE 6

Figure 15A:
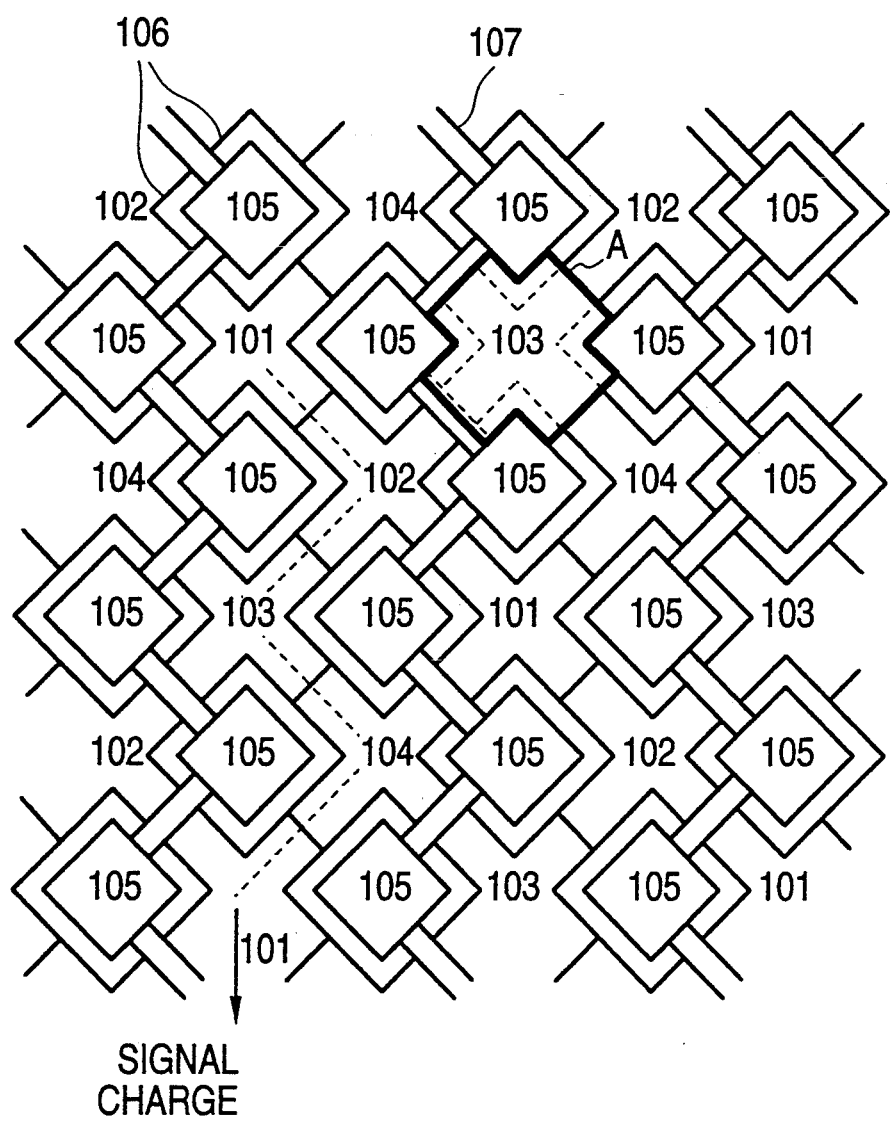
FIGS. 15a to 15d are illustrations for describing a solid state image sensor for making signal charge packets from each of four photodiodes.

FIG. 15a illustrates an image sensing region of a CCD type solid state image sensor. This figure is drawn with particular attention to the impurity concentration of the semiconductor substrate. Also, the regions only are shown in this figure for convenience. The wire connections and overlapping of electrodes and so on are not shown.

In FIG. 15a, 101 to 104 respectively show vertical transfer electrodes. Electrodes labelled the same are electrically connected, constituting a four phase electrode structure. Thus, electrode 101 is a first phase electrode, electrodes 102 to 104 are respectively second to fourth phase electrodes. In FIG. 15a, one of the actual patterns of the vertical transfer electrodes is indicated by the letter A. Each photosensor, is manufactured as a photodiode 105; however, an MOS sensor or stacked photoconductive structure may be used. Read out gate regions 106 with high impurity concentration are covered with the vertical transfer electrodes 101 to 104. Numerals 107 show channel stop regions. In the vertical transfer period in which carriers are transferred along the route as shown by a broken line in FIG. 15a, the potential at the transferring section is the lowest and that of the read out gate region 106 is higher. Therefore, this read out gate region 106 also serves as channel stop.

Figure 15B:
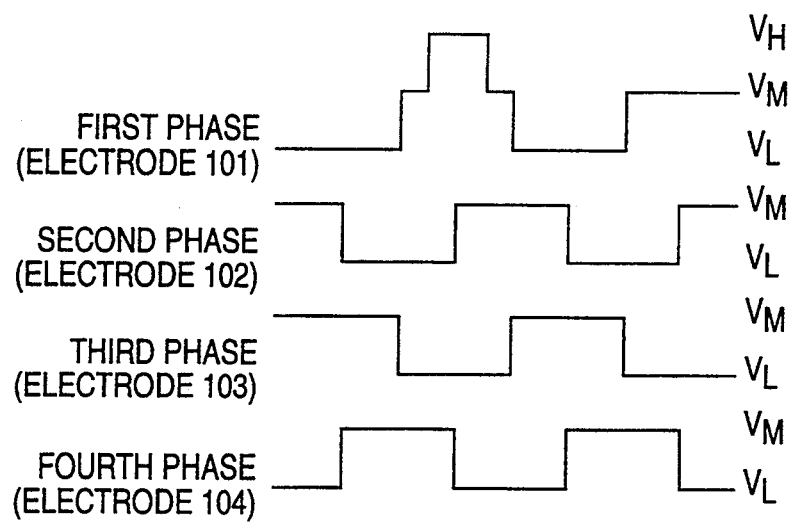
Figure 15C:
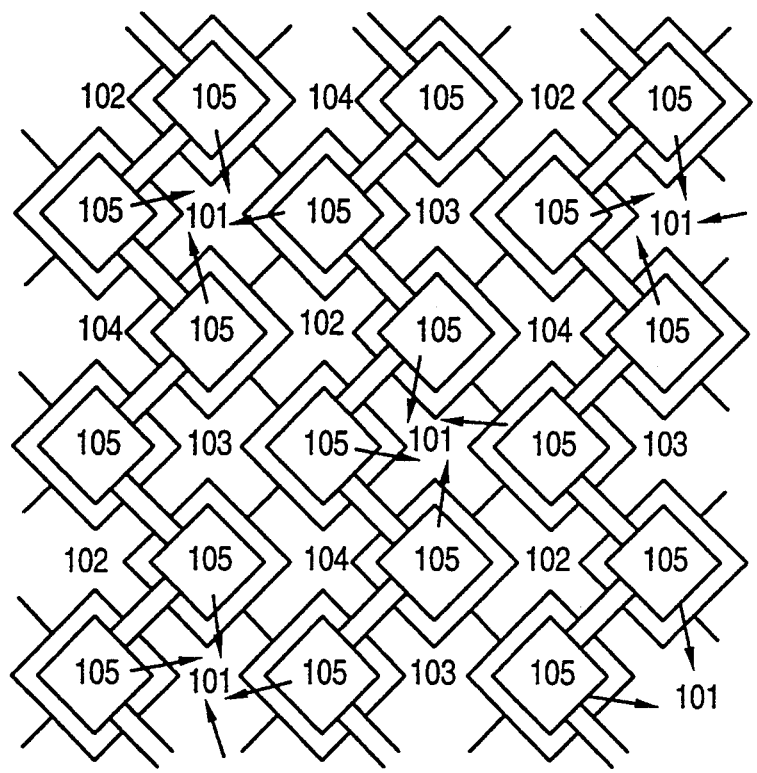
Figure 15D:
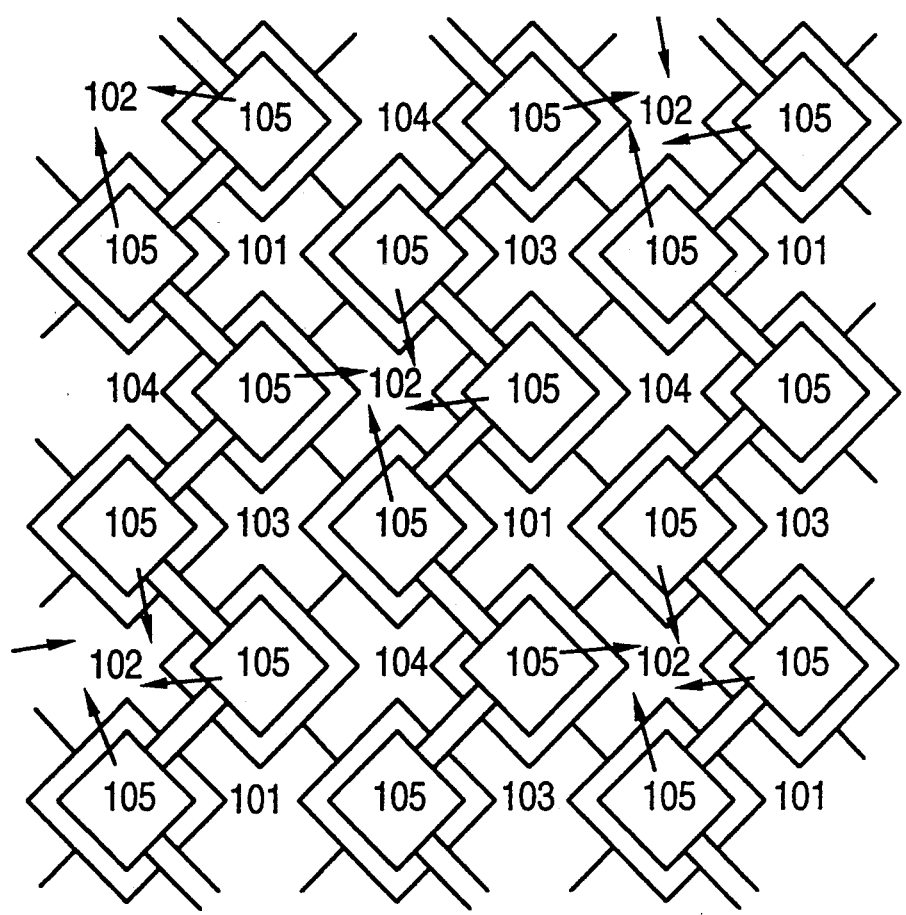

FIG. 15b shows the clock pulses to apply to the vertical transfer electrodes 101 to 104 for vertical transferring of signal charges. Further, FIG. 15c illustrates a charge addition step when a field shift pulse VH is applied to the electrodes 101. FIG. 15d illustrates another charge addition step when the voltage VH is applied to the electrodes 102. Now, referring to these figures, the operation will now be described.

As described before, the vertical transfer electrode is also used as the read out gate electrode. The threshold voltage of the read out gate region is made higher than the drive voltage (VM, for example, 3 V) in the vertical transfer period, thus entry of the carriers from the photosensors during the vertical transfer period does not occur. Four photosensors are adjoined to form one vertical transfer electrode. By applying the field shift voltage VH (for example, 10 volts) to one electrode in four, it is possible to transfer the integrated charge to the channel region beneath the electrode, absorbing and adding the signal charges from four photosensors which are neighbors to the outline of the electrode. For instance, when a field shift pulse is applied to the electrode 101, the charges are transferred as indicated by solid arrow lines in FIG. 15c and, after that, are sequentially transferred from electrode 101 to electrode 102, electrode 103, electrode 104, —, as shown in FIG. 15a. The signal addition of the next stage is performed by causing the field shift as shown in FIG. 15d.

That is, by driving the electrodes to VH one time in each readout cycle and one electrode in four, the added signals obtained from four photodiodes are loaded to the transfer region (beneath the vertical transfer electrode). The combination of the four photodiodes is changeable for every one field, as illustrated in FIG. 15. It is a feature of solid state image sensors of this type that the number of combinations of four photosensors is four, shifting vertically. Accordingly, the reproduced image of one frame consists of four fields.

This type of solid state image sensor is known from Japanese Patent Disclosure (Kokai) No. 61-133782, Nishida et al. In this system, one frame was composed of four fields.

Below is a description of an embodiment applying the present invention to the technology described.

Figure 16A:
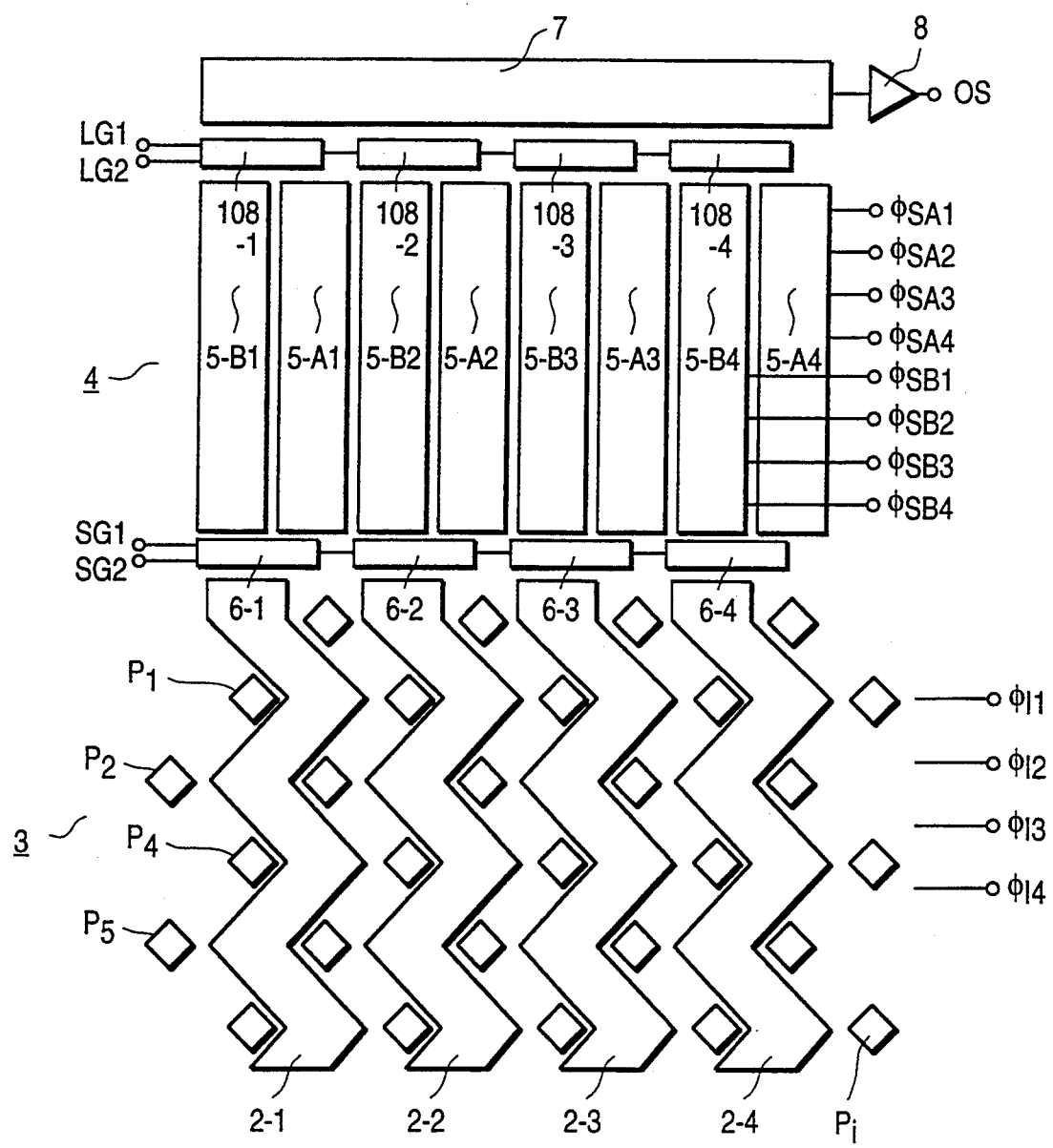
FIGS. 16a to 16c are illustrations of a solid state image sensor of the sixth embodiment of the present invention adaptable to the device shown in FIGS. 15a to 15d.

FIG. 16a is a figure for describing the structure of a solid state image sensor of this embodiment. This device has photodiodes (P1, P2, P3, P4, P5, —, PI: abbreviated as PD hereinafter) and first V CCD registers (2-1, 2-2, 2-3, 2-4). These are formed in a photosensing region 3. Adjoining the photosensing region 126 is a temporary storage region 4 consisting of second V CCD registers A and B (5-A1, %-A2, 5-A3, 5-A4, 5-B1, 5-B2, 5-B3, 5-B4) and a H CCD 7 for reading out the signal charge packets stored in the temporary storage region 4 are formed. The structure of the photosensing region is same as that described in FIG. 15a, and the photodiodes are designed to be read out in four directions. Of the second V CCDs, the transfer electrodes of the V CCDs A (5-A1, 5-A2, 5-A3 and 5-A4) are connected to the terminals $\phi SA1$, $\phi SA2$, $\phi SA3$ and $\phi SA4$. The transfer electrodes of the second V CCDs B are also connected to the terminals $\phi TA1$, $\phi SA2$, $\phi SA3$, and $\phi SA4$. The transfer electrodes of the second V CCDs B are also connected to the terminals $\phi SB1$, $\phi SB2$, $\phi SB3$ and B SB4. Thus, the second V CCDs A and B can be driven independently by respectively applying clock pulses to their terminals. Also, the transfer electrodes of the first V CCDs are connected to the terminals $\phi I1$ to $\phi I4$, and the first V CCDs can perform the signal charge transfer operation by applying predetermined clock pulses to these terminals. The first gates 6-1, 6-2, 6-3 and 6-4 positioned between the photosensing region and the temporary storage region are for shifting the transfer direction from the first V CCDs to the second V CCDs A or the second V CCDs B. Also shown are second gates 108-1, 108-2, 108-3, and 108-4 for selecting the transfer stages.

The signal charge packets transferred to the temporary storage region are then transferred to the H CCd 7 and read out from the output terminal OS through a amplifier 8.

Referring to the FIG. 16b, the image sensing operation will now be described.

Figure 16B:
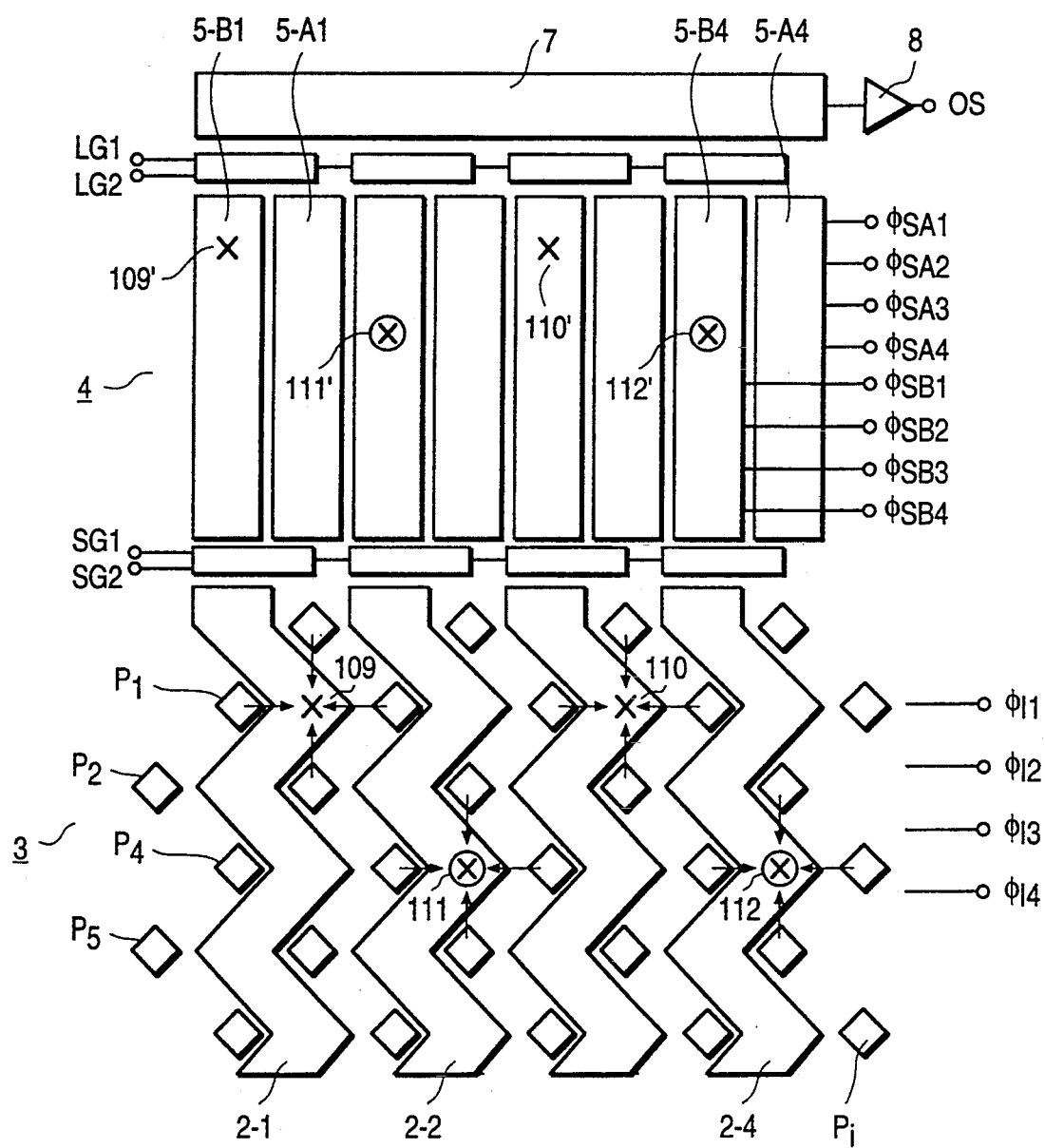
Figure 16C:
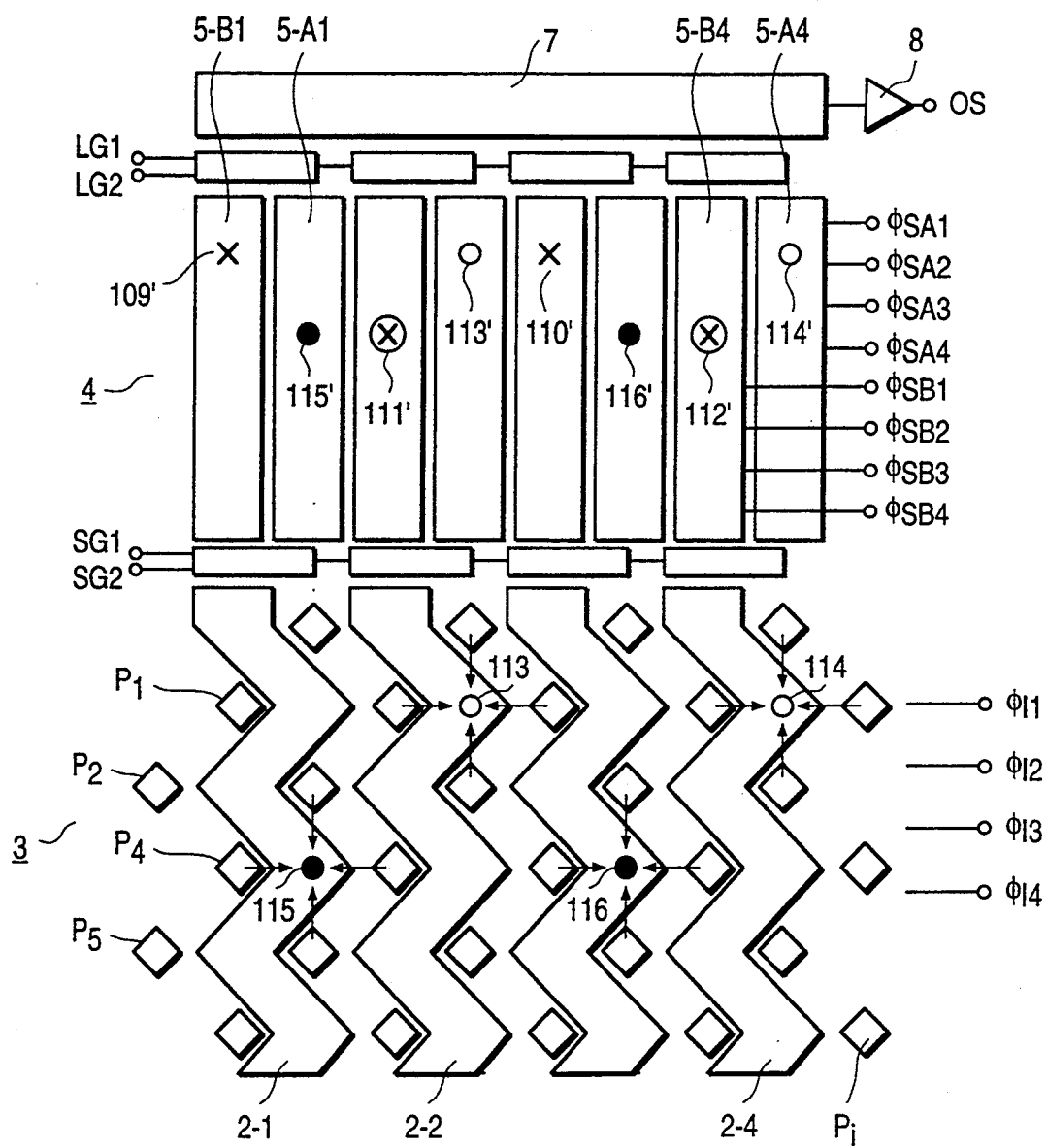
Figure 17A:
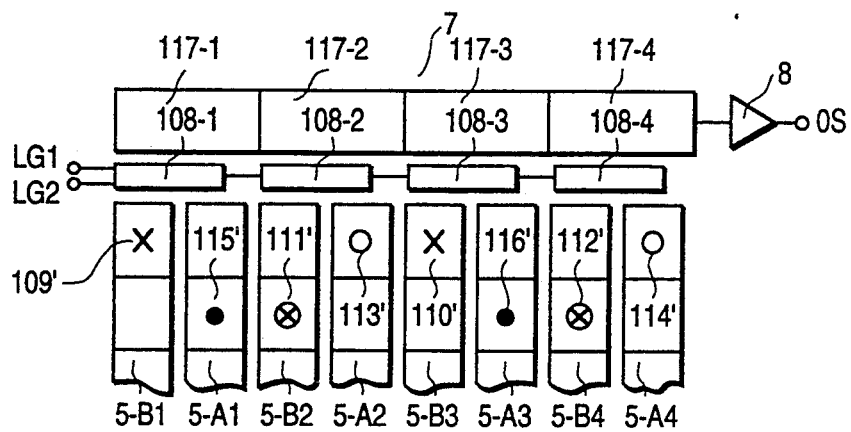
FIGS. 17a through 17e show the transferring steps from the temporary storage region to a horizontal CCD resister.
Figure 17B:
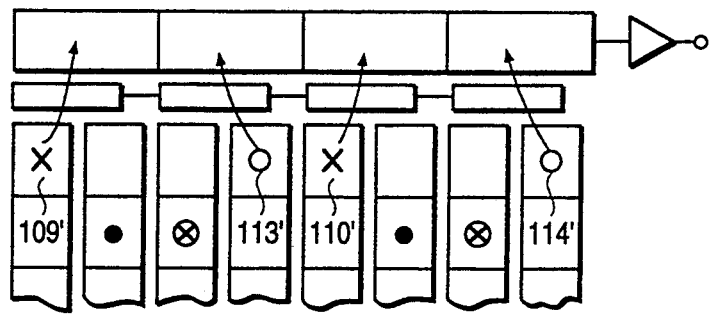
Figure 17C:
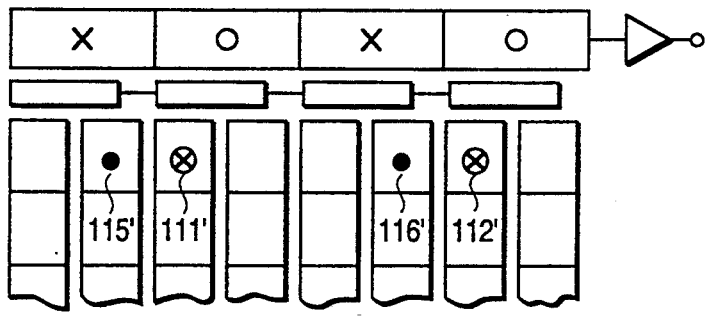
Figure 17D:
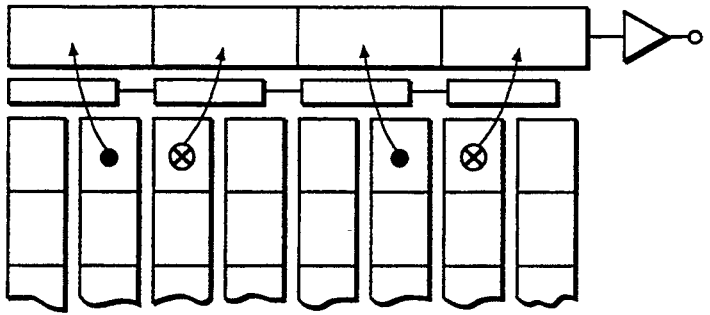
Figure 17E:
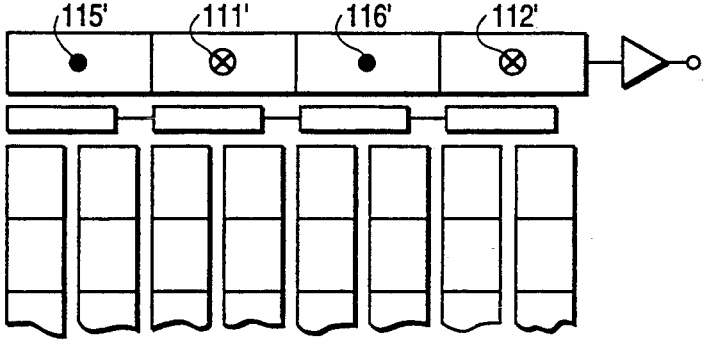

As shown in the photosensing region 3 of FIG. 16b, the signal charges read out from four photodiodes are added, thus forming signal charge packets 109, 110, 111 and 112 (X, $\overline{X}$). This first adding operation is performed at the mid-point of the first field. At the same time, the photodiodes start the next signal charge integration. The signal charge packets collected with the first adding operation are transferred from the first V CCDs 2-1, 2-2, —, 2-4 to the second V CCDs B 5-B1, 5-B2, 5-B3 and 5-B4 by applying four phase clock pulses to the terminals φI1 to φI4 and φSB1 to φSB4. These first signal charge packets are defined as 109′, 110′, 111′ and 112′. Then, in the same field period, as shown in the photosensing region 3 in FIG. 16c, signal charges of four photodiodes are added based on a different combination to form signal charge packets 113, 114, 115 and 116 (0, ).

The signal charge packets 113, 114, 115 and 116 of the second adding action are then transferred from the first V CCDs to the second V CCDs A as 113′, 114′, 115 and 116′ by applying clock pulses to the first V CCDs and second V CCDs A.

Then, in the next field, the signal charge packets 109; to 112′ and 113′ to 116′, —, are transferred to the H CCD 7 through the second gates 108-1, 108-2, —, 108-4, and then, are read out from the amplifier 8 in turn.

Thus, the signal charge packets 109 to 112, and 113 to 116, —, which need two fields to be read out in the conventional technique, can be read out in one field. During the field period where signal charge packets of the first and second combination groups are being read out, the addition of signal charge packets of the third and fourth groups and their transfer to the second V CCDs are simultaneously performed. Thus, the problems associated with low dynamic resolution and an increase of after image are improved.

FIG. 17a to FIG. 17e illustrate the steps for reading out the signal charge packets 109′ to 112′ and 113′ to 116′ stored in the temporary storage region 4 from the H CCD 7. Into the transfer stages 117-1 to 117-4 of the H CCD register 7, the signal charge packets 109′, 113′, 110′ and 114′ in the second V CCDs A and B are transferred through the second gates 108-1 to 108-4.

Similarly, the signal charge packets 115′, 111′, 116′ and 112′ in the second V CCDs A and B are loaded into the transfer stage 108-1 to 108-4, after sweeping the previous signal charge packets in the H CCD7.

Figure 18A:
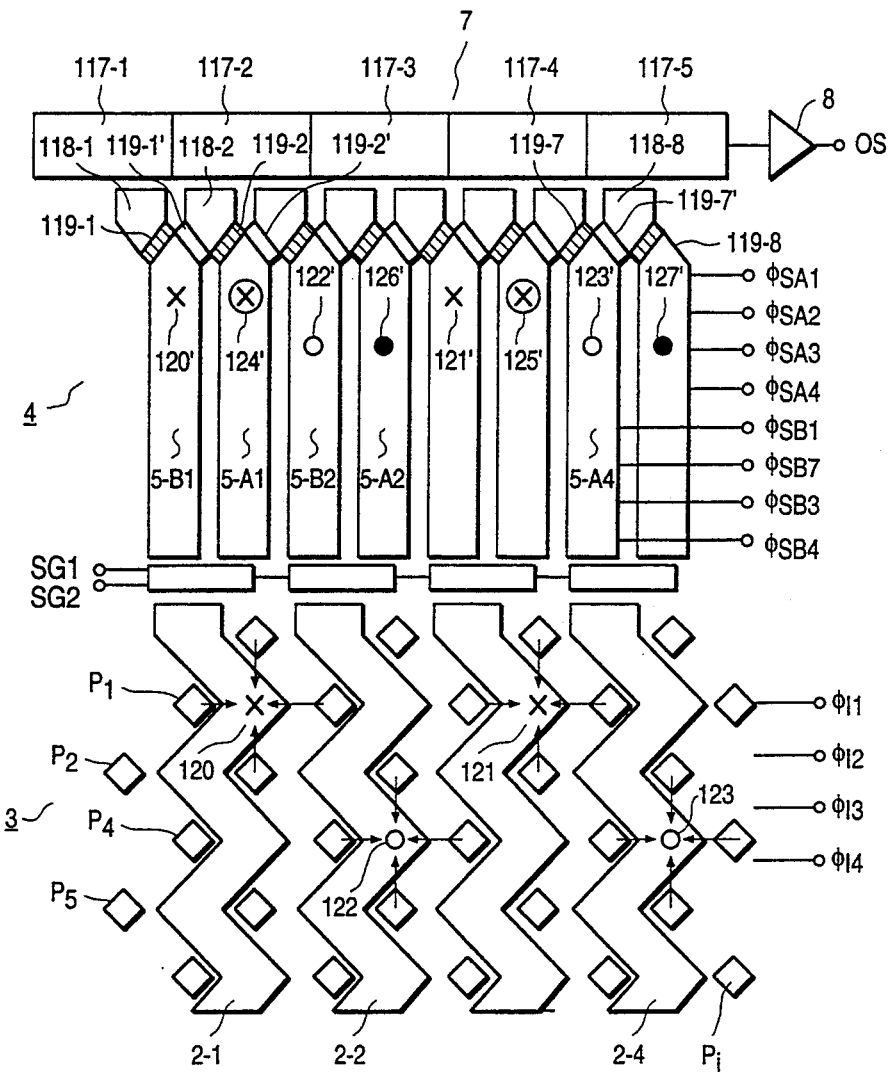
FIG. 18a shows a modified embodiment of FIG. 16a which acts as a synchrovision type.
Figure 18B:
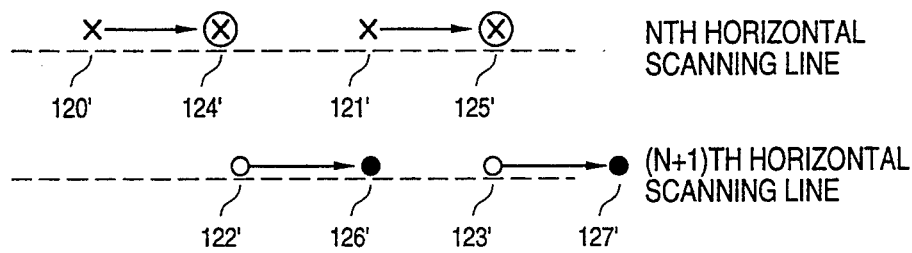
FIG. 18b shows an illustration of the signal charge packets corresponding to the scanning lines of a TV.

FIG. 18a and FIG. 18b are figures illustrating a modification of the embodiment of FIG. 16 and FIG. 17. This embodiment is a solid state image sensor to obtain a high resolution image by relatively vibrating the CCD chip toward an incident image. The structure of the photosensing region 3 is the same as that of FIG. 16a. The second V CCDs 5-B1 to 5-B4 and 5-A1 to 5-A4 are located between photosensing region 3 and H CCD 7. The structure is basically the same as in FIG. 16 and 17, except for having third gates 118-1, 118-2, —, 118-8 and signal charge distribution gates 119-1, 119-2, —, 119-8, 119-1;, 119-2′, —, 119-7′. After performing signal charge addition to obtain signal charge packets 120, 120, 122 and 123 (X,O) at the midpoint of the first field, the packets are transferred to the second V CCDs B in the same field period. After carrying out the signal charge addition at the midpoint of the first field described, the CCD chip is horizontally swung to the position of new sites shifted ½ PH form the original site. Then, the signal charge addition of the same photodiode combination is carried out, and then, these signal charge packets are transferred to the second V CCDs A and B (Ⓧ, ), in the same field (first field). In the next field (second field), the signal charge packets 120′, 124′, 121′, 125′ are firstly read out through the H CCD 7, and then, signal charge packets 122′, 126′, 123′ and 127 are read out, and this cycle repeats in the second field. In this case, the space sampling points obtained during the first field are shown in FIG. 18b, thereby doubling the number of sampling points as compared with the prior art.

Figure 19A:
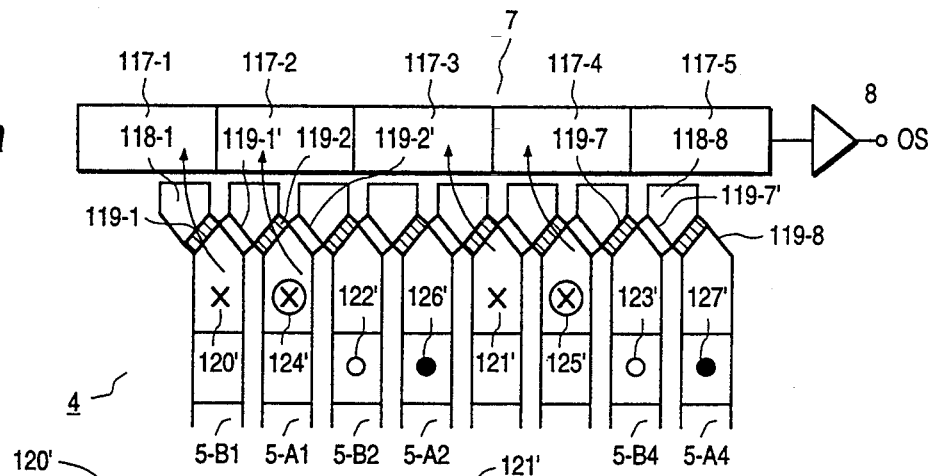
Figure 19B:
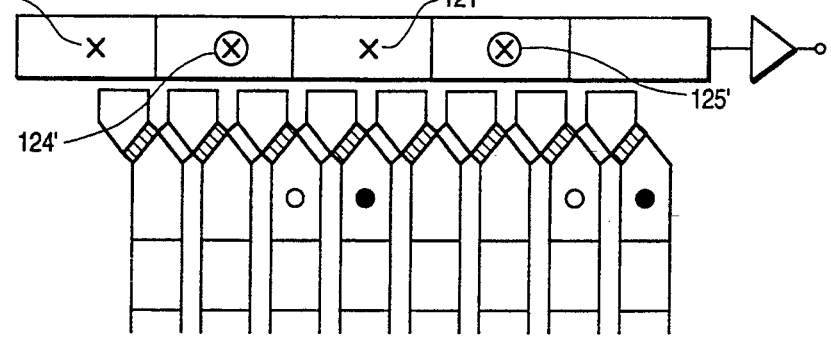
Figure 19C:
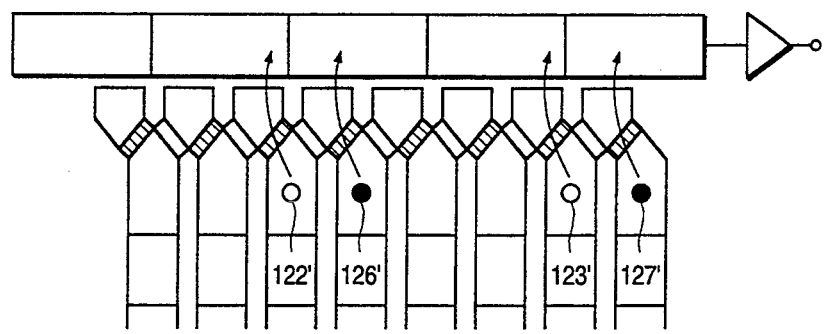
Figure 19D:
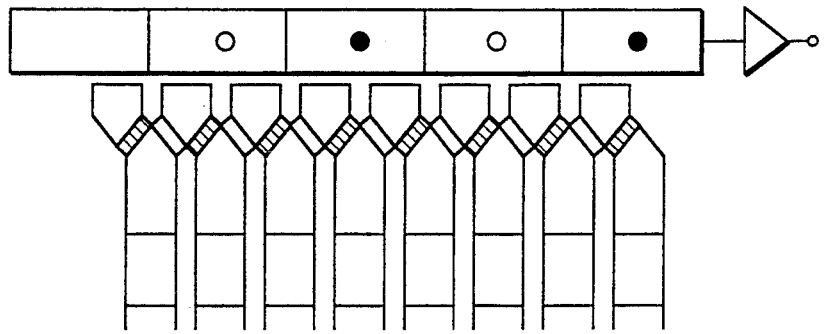

As shown in FIGS. 19a to 19d, the signal charge packets 120′ 124′ 121′ and 127′ at the marks X and Ⓧ in FIG. 19a are loaded into the H CCD 7 by switching on the first charge distribution gates 119-1 to 119-8 and the second gates 118-1 to 118-8 as shown in FIGS. 19a and 19b. At the same time, the signal charge packets 112′, 126′, 123′ and 127′ marked 0 and    are also transferred one stage upward along the second V CCDs. In the beginning of the horizontal effective period of the second field, the signal charge packets 120′, 124′, 121′ and 125′ are read out from the output terminal OS. Then in the following horizontal blanking period, the signal charge packets 122′, 126′, 123′ and 127′ are loaded into the H CCD 7 as shown in FIGS. 19c and 19. As seen in these figures, the signal charge distribution gates are used for changing the transfer direction to the transfer stages 117-1 to 117-5 of the H CCD 7. In the embodiment described above, the number of operations of signal charge addition in one field is two; however, there may be more. Also, the second V CCDs may have more than two groups.

EXAMPLE 7

Figure 20:
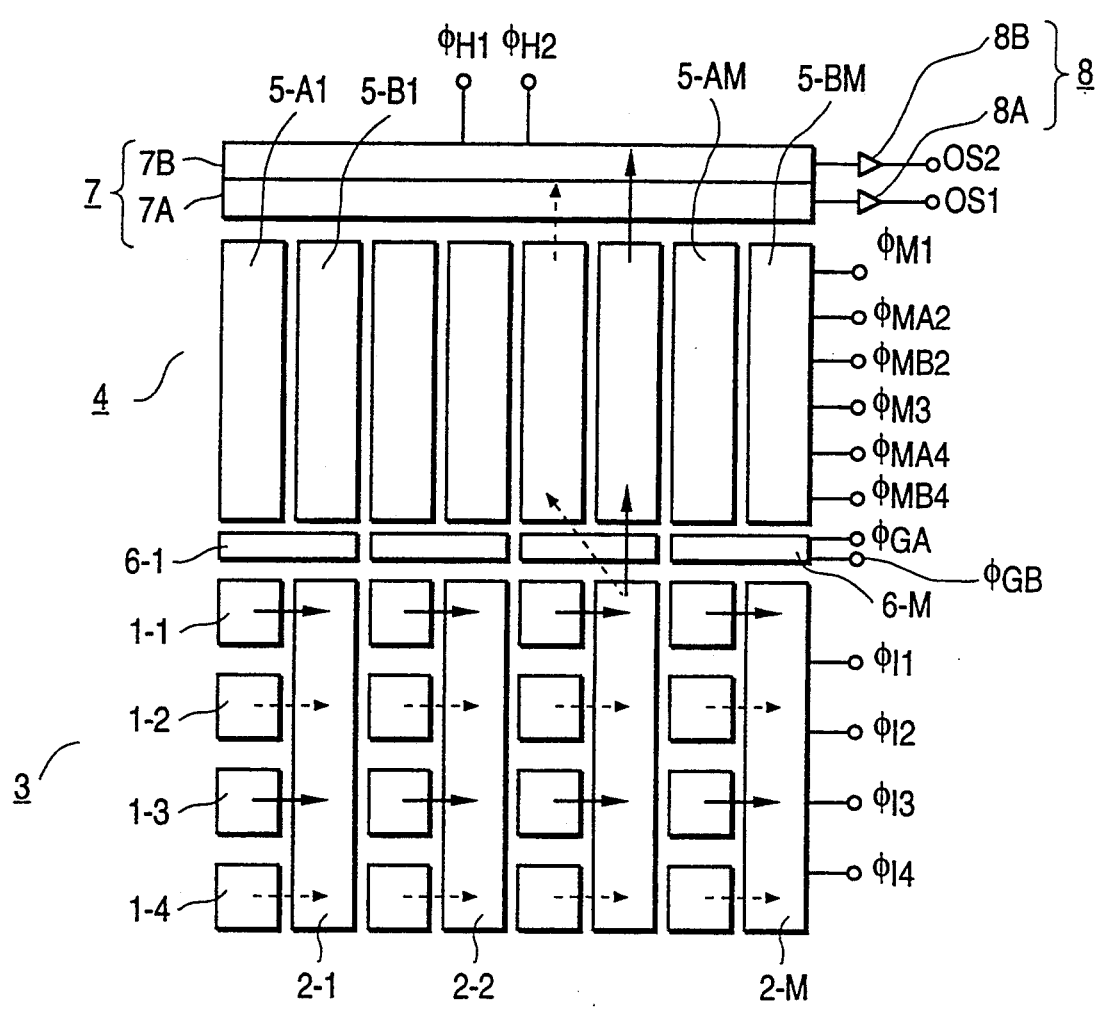
FIG. 20 shows a plan view of a solid state image sensor of a seventh embodiment.

FIG. 20 is a plan view of a solid state image sensor of this example.

On a semiconductor substrate, photodiodes (1-1, 1-2, —, 1-N) and first V CCDs (2-1, 2-2, —, 2-M) are formed in a photosensing region 3. The first V CCDs are driven by four phase clock pulses at terminals φI1--φI4. Adjacent to the photosensing region 3, second V CCDs A and B (5-A1, 5-A2, —, 5-AM, 5-B1, 5-B2, —, 5-BM) are arranged in the temporary storage region 4, and are driven by clock pulses at terminals φM1, φMA2, φMB2, φM3, φMB4. Between the first V CCDs and the second V CCDs A and B, there are formed a plurality of gate means (6-1, 6-2, —, 6-M) controlled by clock pulses φGA and φGB. At the top, H CCDs 7A and 7B and amplifiers 8A, 8B connected to output terminals OS1, OS2 are formed.

In FIG. 20, the frame integration mode is shown. That is, signal charges stored in the photodiodes of every other row (horizontal) are transferred to the first V CCDs at the same time as shown by solid lines, and are transferred to the second V CCDs A. Successively, the signal charges stored in the remaining photodiodes are transferred to the first V CCDs as shown by broken lines, and are transferred to the second V CCDs B. After loading into the second V CCDs A and B is completed, the signal charges in the second V CCDs A and B are read out from the chip through H CCD 7, for example, in synchronism with the horizontal scanning on the TV. Certainly, the field integration mode may be adopted.

Figure 21A:
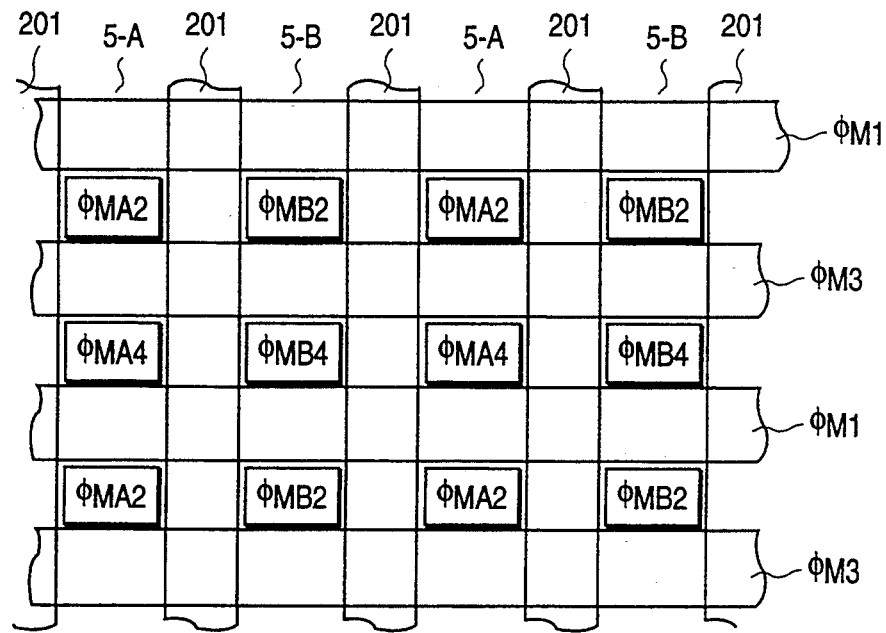
FIG. 21a is an enlarged plan view of the temporally storage region of FIG. 20.
Figure 21B:
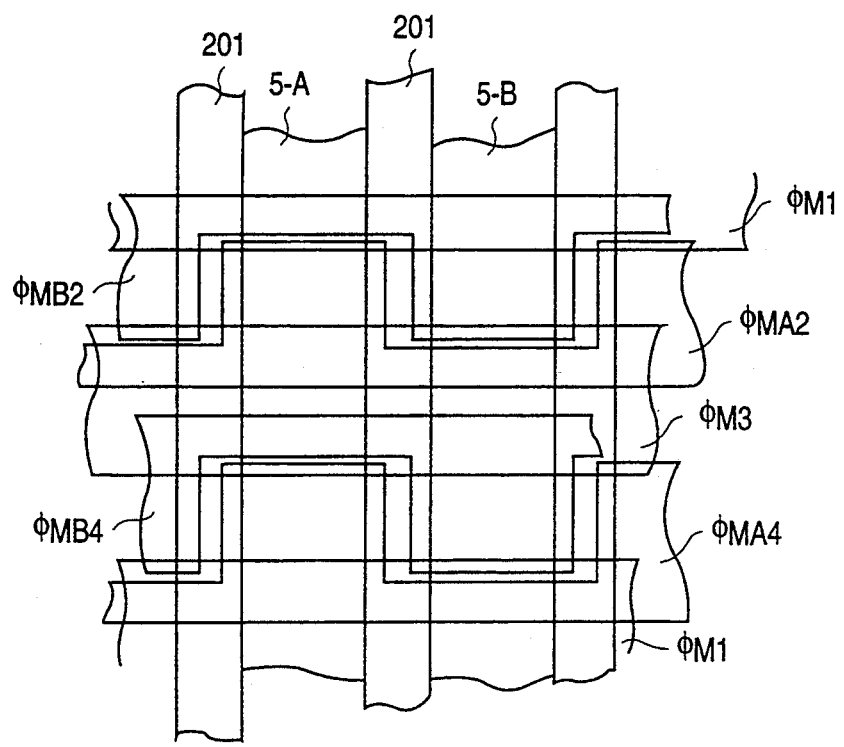

FIG. 21a is an enlarged plan view of the temporary storage region 4 of FIG. 20, and FIG. 21b is the detailed structure of FIG. 21a. The transfer electrodes of the second V CCDs A and B are shown in FIG. 21a. First channel regions 5-A (channel regions of the second V CCDs A) and second channel regions 5-B (channel regions of the second V CCDs B) are separated by channel stopper regions 201. In this embodiment, the substrate is a p-type Si substrate. The channel regions are n-type, the channel stopper regions 201 are p+-type. In the first channel region 4-A, one transfer stage is composed of first transfer electrode φM1, second transfer electrode φMA2, third transfer electrode φM3 and fourth transfer electrode φMA4. In the second channel region 5-B, one transfer stage is composed of first transfer electrode φM1, second transfer electrode φMB2, third transfer electrode φM3 and fourth transfer electrode φMB4. In FIG. 21a, first transfer electrode φM1 and third transfer electrode φM3 are common for both the first and second channel regions 5-A and 5-B. Second transfer electrodes φMA2, MB2 and fourth transfer electrodes φMA4, φMB4 are respectively formed for the first or second channels 5-A, 5-B. First transfer electrode φM1 and third transfer electrode φM3 are made from a first layer of polycrystalline silicon. On the other hand, second transfer electrodes φMA2, φMB2 and fourth transfer electrodes φMA4, φMB4 are made from a second layer of polycrystalline silicon. Second transfer electrodes MA2, φMB2 and fourth transfer electrodes φMA4, φMB4 are illustrated independently in FIG. 21a. However, actually, second transfer electrodes φMA2 and fourth transfer electrodes φMA4 in first channel regions 5-A, and second transfer electrodes φMB4 and fourth transfer electrodes φMB4 in second channel regions 5-B, are arranged continuously and extend from parts of the electrodes above the first layer electrodes as shown in FIG. 21b.

The electrodes of φM1 and φM3 are parallel transfer electrodes formed crossing pairs of first and second channel regions 5-A and 5-B.

The electrodes of (φMA2, φMB2), (φMA4, φMB4) are pairs of transfer electrodes, respectively, having comb-shaped parts which run across the first and second channel regions and are positioned above the parallel transfer electrodes. These extend to spaces between the parallel transfer electrodes. The transfer electrodes are insulated from each other, respectively, with an insulating layer between the substrate and the parallel transfer electrodes, and between the parallel transfer electrodes and the pairs of transfer electrodes.

The imaging operation of the solid state image sensor thus constructed is as follows. Signal charges in the photodiodes (1-2, 1-4, —) of even numbered horizontal rows are transferred to the first V CCDs at the same time, then, are read out to the first channels 5-A of the second V CCDs A, in a first period. In a second period, signal charges corresponding to the odd numbered horizontal rows of the photodiode matrix, that is, ones of photodiodes (1-1, 1-3, —), are read out to the first V CCDs at a same time, then, are transferred to the channel regions 5-B of second V CCDs B. The switching operation is performed by the switching means.

Figure 22:
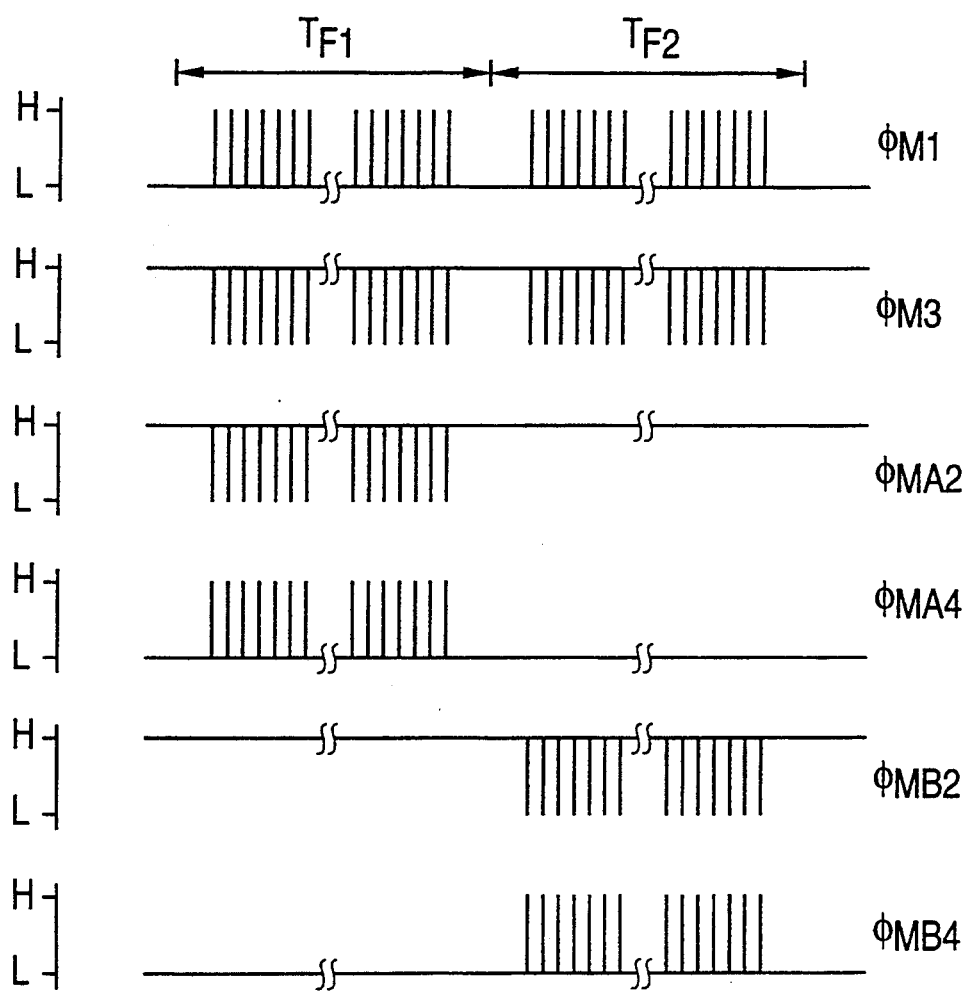
FIG. 22 is a timing chart showing the transferring of signal charges from the first V CCDs to the second V CCDs A and B of the embodiment of FIG. 20.
Figure 23:
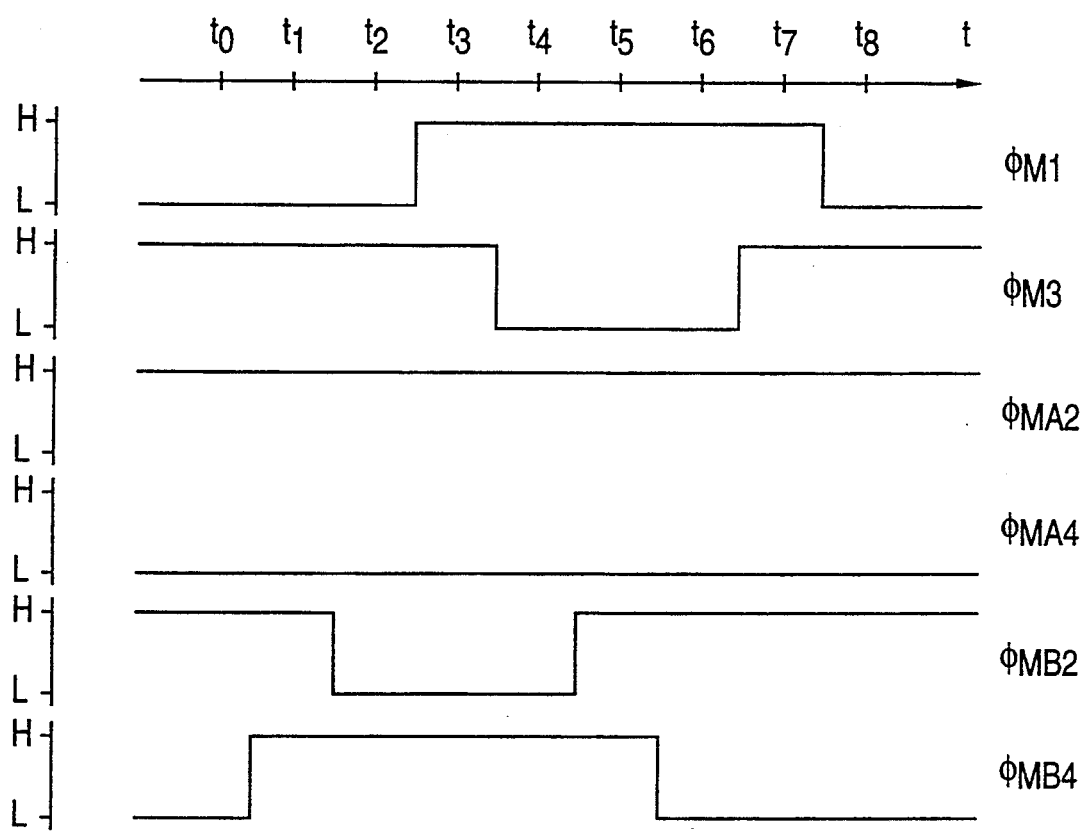
FIG. 23 is an enlarged plan view of waveforms shown in FIG. 22.

FIG. 22 is a timing chart which shows the transferring of signal charges from first V CCDs to second V CCDs A and B. FIG. 23 is an enlarged view of FIG. 22.

In a first period TF1 of FIG. 22, signal charges in first V CCDs are transferred to first channel regions 5-A of second V CCDs A and stored by applying four phase clock pulses φM1, φMA2, φM3 and φMA4, thus enabling the transferring of signal charges from the first V CCDs to the second V CCDs A. In a second period TF2, four phase clock pulses φM1, φM2, φM3 and φM4 are applied, thus enabling the transferring of signal charges from the first V CCDs to the second V CCDs B. In the first period TF1, φMB2 is kept at a high level, and φMB4 is kept at a low level. Similarly, in the second period TF2, φMA2 is kept at a high level, and φMA4 is kept at a low level. Therefore, second V CCDs A and B operate independently.

FIG. 23 shows the enlarged waveforms of φM1–φMB4 in the period TF2.

Figure 24:
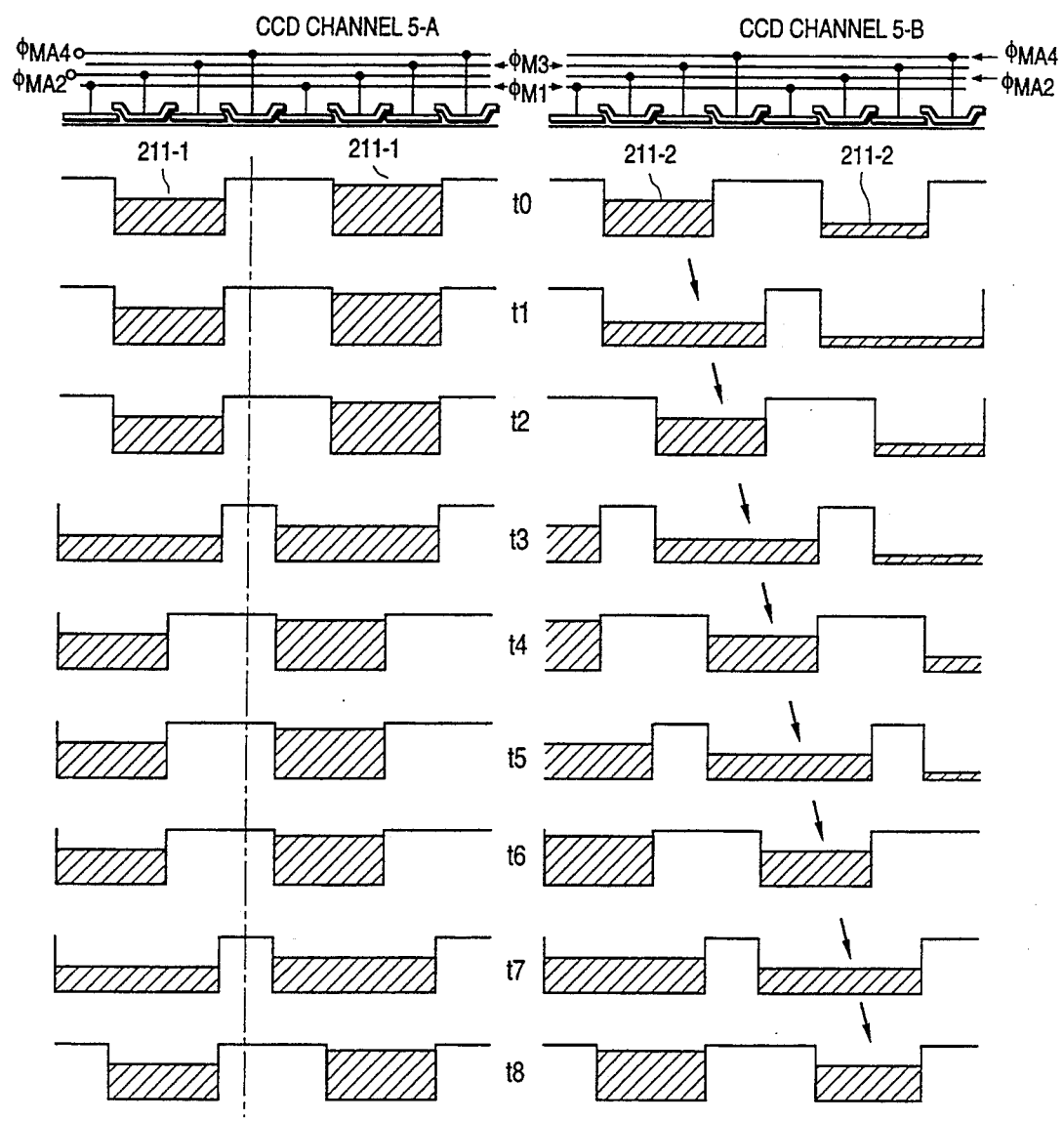
FIGS. 24a and 24b are diagrams showing the transferring of signal charges in the second V CCDs B corresponding to the state shown in FIG. 23.

FIGS. 24a and 24b show transferring in the first channel region 5-A and the second channel region 5-B in the state shown in FIG. 23. The timings T0 to T8 in FIG. 23 correspond to those shown in FIG. 24.

As shown in FIG. 23, transfer electrodes φM1, φMB2, φM3 and φMB4 of second V CCDs B are applied with conventional four phase clock pulses. At a timing t0, signal charges 211-2 are stored beneath the two electrodes of φMB2 and φM3 in the second V CCDs B, as shown in FIGS. 24a and 24b. At timing t1, the transferring operation begins by raising φMB4 to a high level. Thus, the signal charges 211-2 are stored beneath three electrodes of φMB2, φM3 and φMB4. At t2, φMB2 becomes low, signal charges 211-2 are stored beneath the two electrodes of φM3 and φMB. As shown, by repeating the two-electrode-storing and three-electrode-storing, the signal charges 211-2 are stored beneath the next two electrodes of φMB2 and φM3, and one transferring cycle ends. On the other hand, during the transferring operation, φMA2 is kept high and φMA4 is kept low in the second V CCDs A as shown in FIG. 23. Therefore, the signal charges 211-1 are located beneath the electrodes without any transfer taking place.

Figure 25:
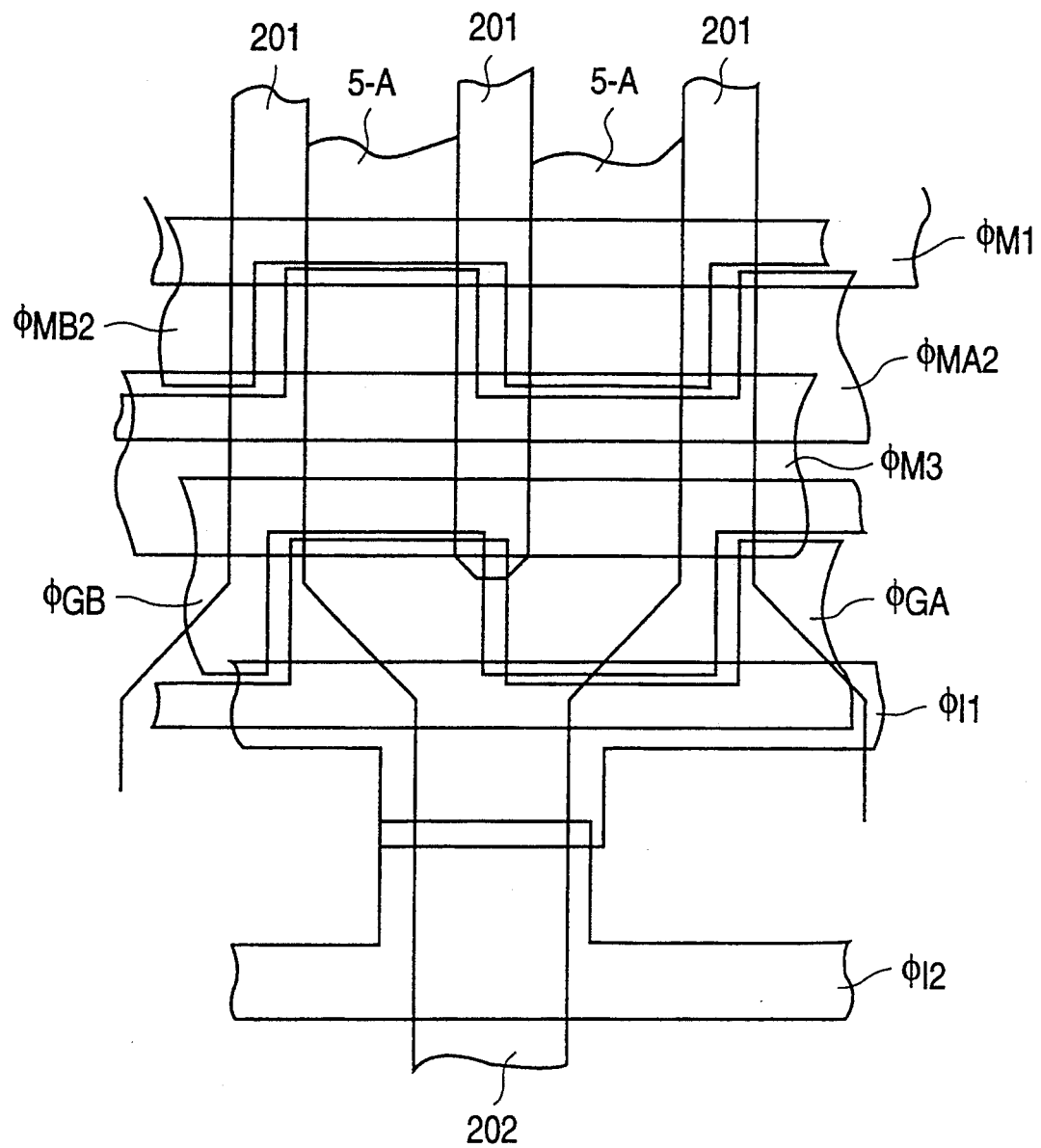
FIG. 25 is an illustration of the connection of the first V CCD to the second V CCDs A and B through gates.

FIG. 25 is an illustration of the connection part of the first V CCD to the second V CCDs A and B through the gate. One end of the channel region of the first V CCD is connected to the channel region 5-A and 5-B of the second V CCDs A and B. At the connecting region, switching electrodes φGA and φGB made from the second layer polycrystalline silicon are arranged. The waveforms applied to the switching electrodes φGA and φGB are the same as those applied to the transfer electrodes φMA4 and φMB4.

Figure 26:
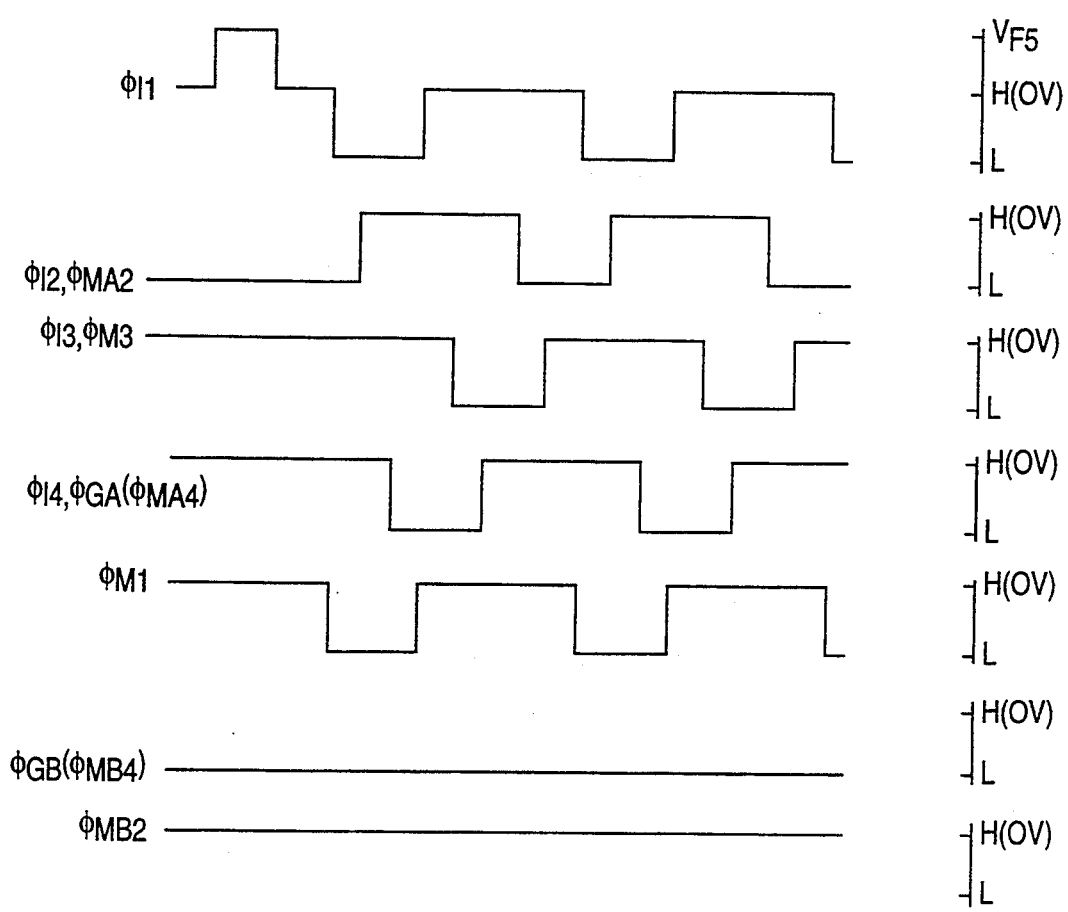
FIG. 26 is a timing chart of clock pulses applied to transfer electrodes when signal charges are transferred from the first V CCDs to the second V CCDs b.
Figure 27:
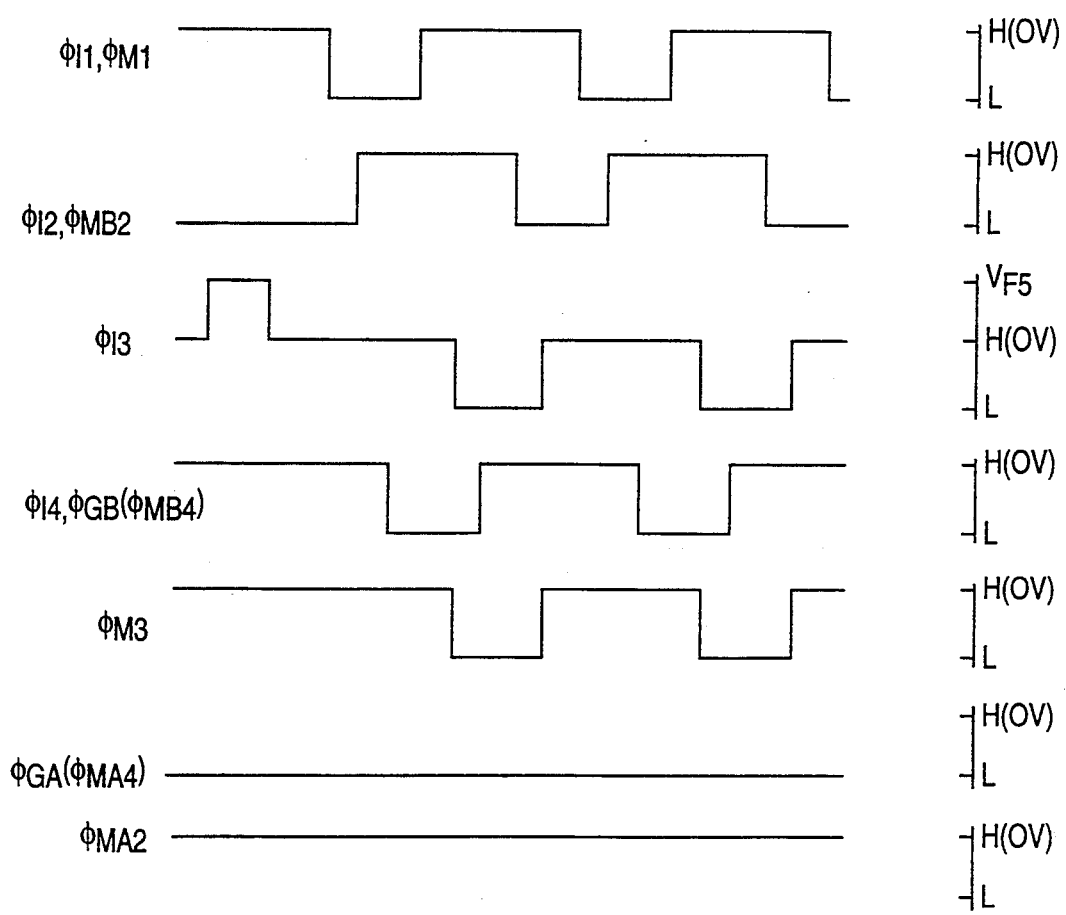
FIG. 27 is a timing chart of clock pulses applied to transfer electrodes when signal charges are transferred from the first V CCDs to the second V CCDs A.

FIG. 26 is a timing chart of the clock pulses applied when signal charges are transferred from the first V CCDs to the first channel regions 5-A of the second V CCDs A. In this instance, φGB is kept low thus forming a potential barrier for the second channel regions 5-B. And, four phase clock pulses shown in FIG. 26 are applied to the electrodes φGA, φM1, φMA2, φM3 and φMA4 of the first channel regions 5-A side, together with the transfer electrodes φI1 to φI4. According to the clock pulses, signal charges in the first V CCDs are transferred to the second V CCDs A. In the case that signal charges are transferred to the second V CCDs B, clock pulses shown in FIG. 27 are applied. In this state, the switching gate φGA is kept low.

Figure 28:
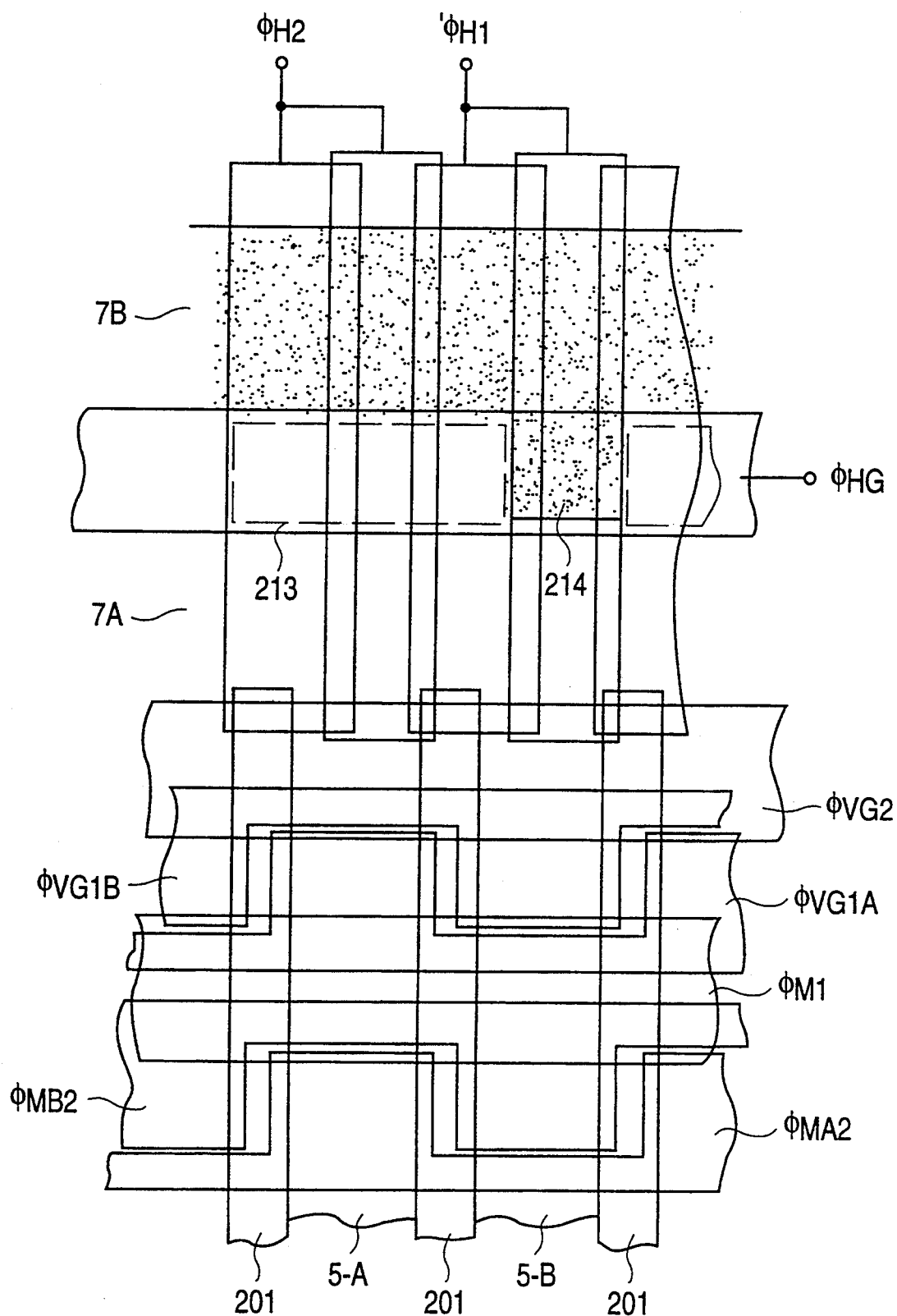
FIG. 28 is a figure showing an enlarged plan view of the transferring part from second V CCDs A and B to H CCD.

FIG. 28 is an enlarged plan view of the transferring part from the second V CCDs A and B to the H CCDs 7A and 7B.

In this embodiment, there are shown transfer gates φVG1A, φVG1B formed on the channel regions 5-A, 5-B and transfer control electrode φVG2 commonly formed on the channel regions 5-A, 5-B, are arranged. The φVG1A and φVG1B gates are formed for adjusting the transfer stage. The H CCD 7B receives signal charges from the second channel region 5-B, and has a deep potential as compared with the H CCD 7A, by doping n-type impurities at a higher concentration compared with the H CCD 7A. Beneath a transfer control electrode φHg, potential barrier region 213 doped with a p-type impurity and transfer region 214 having the same potential as that of the channel of the H CCD 7B are alternatively formed. Signal charges from the first channel regions 5-A of the second CCDs A are stopped at the potential barrier region 213. On the other hand, signal charges from the channel of the second V CCDs B are passed through the transfer region 214 and reach the H CCD 7B.

Figure 29:
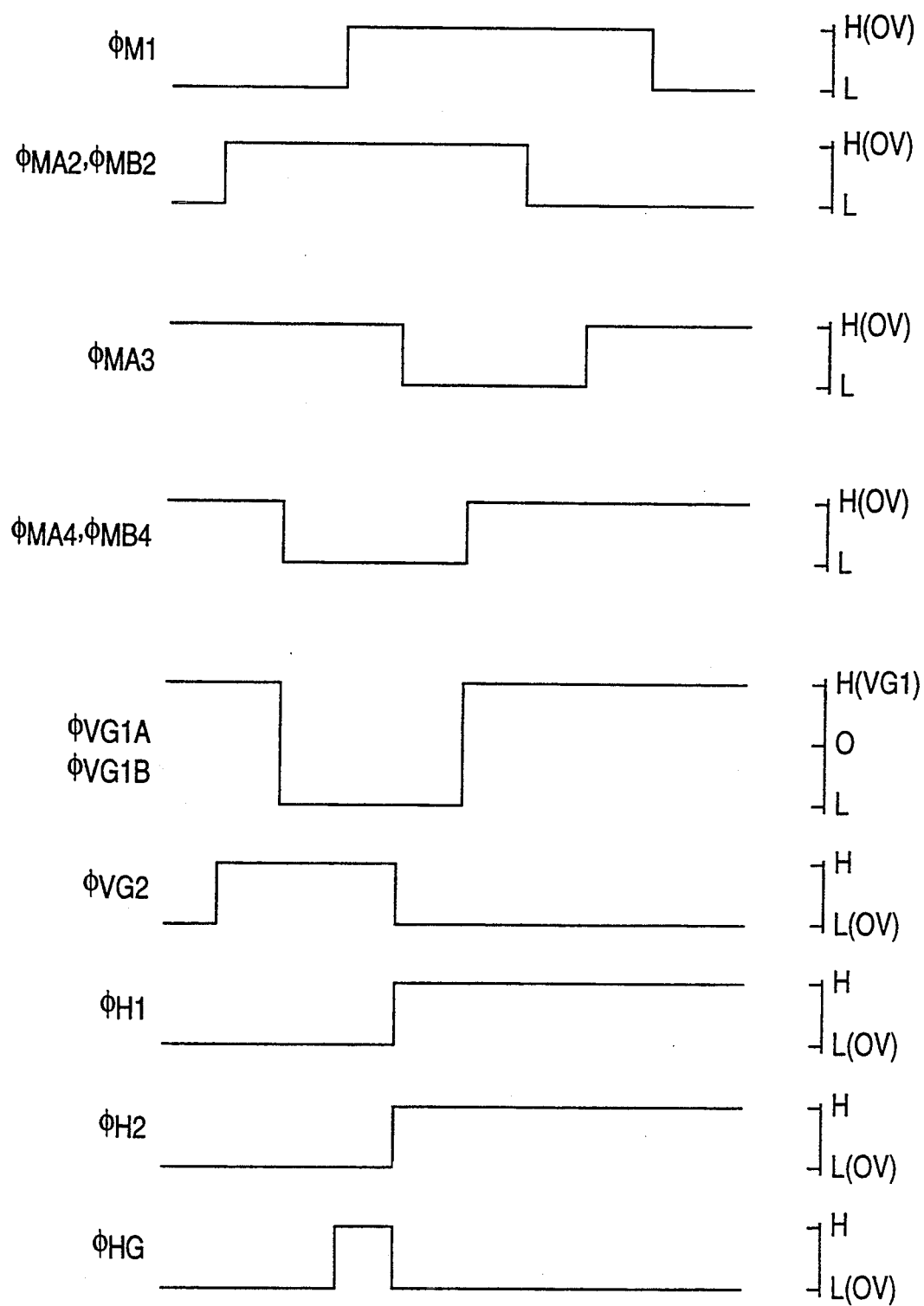
FIG. 29 is a diagram showing waveforms for transferring signal charges from second V CCDs to H CCD.

FIG. 29 is a diagram showing waveforms for transferring signal charges from second V CCDs A and B to the H CCD 7A and 7B.

Signal charges in the second V CCDs A and B thus stored are respectively transferred to the H CCD 7A and 7B, by setting $\phi$VG1A, $\phi$VG1B to a high level, then, raising $\phi$VG2 to a high level and then dropping $\phi$VG1A, $\phi$VG1B to a low level, and then raising the transfer control gate $\phi$GH to a high level. After that, signal charges in the two channel regions 7A and 7B of the H CCD are read out in parallel to the outputs by applying conventional two phase clocks to the transfer electrodes H1 and H2 commonly attached to the H CCDs 7A and 7B.

As describe, according to the present embodiment, signal charges in all photodiodes are able to be read out in one field, while driving second V CCDs A and B independently. The definition power is improved by reading out all the signal charges in one field period in this manner.

Further, the second V CCDs A and B are driven independently without any necessity to use metal interconnection layers, though comb shape patterning of the transfer electrodes of the second V CCDs is demanded.

In the above embodiment, the second V CCDs are driven with four phase clock pulses. However, two phase drive may be adopted as well be shown hereinafter.

Figure 30A:
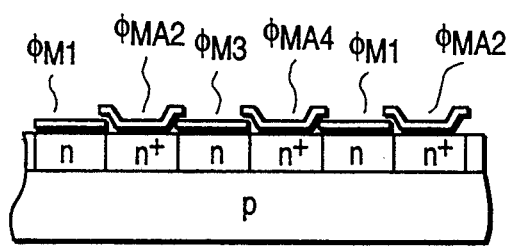
FIGS. 30a–30c are figures showing a cross sectional view of the second V CCDs of a modification of the seventh embodiment.
Figure 30C:
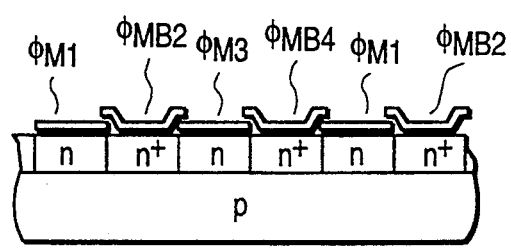

FIGS. 30a and 30c are a cross section of the second V CCDs A and B. Other parts are the same as those of the above embodiment.

In this embodiment, which shows an n-channel structure, the device is formed as follows. Initially, n-type regions are formed continuously at the channels of the second V CCDs A and B. Then, n+-type regions are formed by ion implanting phosphorous in the channel regions, after forming first and third transfer electrodes $\phi$M1, $\phi$M3 from a first layer of polycrystalline silicon and using these layers as masks. Then, second transfer electrodes $\phi$MA2, $\phi$MB2 and fourth transfer electrodes $\phi$MA4, $\phi$MB4 are formed from a second layer of polycrystalline silicon. Thus, the channel potential beneath the second and fourth transfer electrodes is set deeper then that of the first and third transfer electrodes.

Figure 30B:
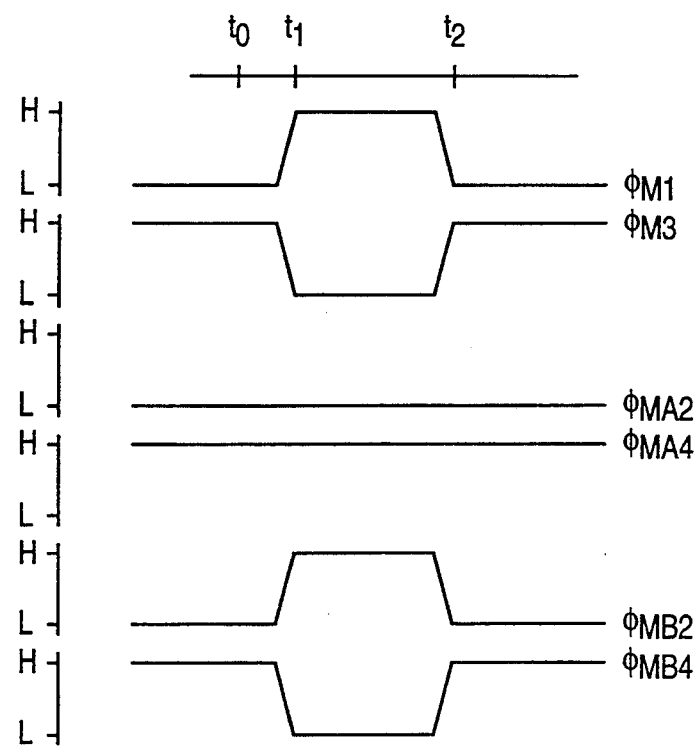

The transferring operation of the second V CCDs A and B is described referring to FIG. 30b. Also in this embodiment, the basic operation is not changed from that discussed above. Namely, signal charges of half of the photodiodes are transferred to the first channel regions 5-A of the second V CCDs A through the first V CCDs in a first period and then signal charges of the remaining photodiodes are transferred to the second channel region 5-B of the second V CCDs B through the first V CCDs in a second period. FIG. 30b shows the transferring waveforms of one transferring stage cycle of the second V CCDs B. FIGS. 31a and 31b show the condition of the transferring waveforms of one transferring stage cycle of the second V CCDs B. FIGS. 31a and 31b show the condition of the transferring of signal charges in second V CCDs A and B corresponding to FIGS. 30a and 30c.

The timings t0 to t2 correspond to those in FIGS. 30a and 30c. The same drive pulses are applied to the terminals of $\phi$M1, $\phi$MB2 and reversed clock pulses are applied to the terminals of $\phi$Mc, z$\phi$MB4, when transfer electrode $\phi$MA2 is low and $\phi$MA4 is high. As a result, as shown in FIGS. 31a and 31b, signal charges 212-1 are not moved in the first channel regions 5-A and signal charges 212-2 are transferred in the second channel regions 5-B.

In this embodiment, the channel potential is controlled by ion implantation. However, the selective ion implantation may be neglected by controlling the levels of drive pulses.

Further, in the above embodiment, the frame integration mode was described. However, the field integration mode may be adopted. That is, in the case of field integration, signal charges in each photodiode pair along the vertical direction are added and transferred to the second V CCDs B through the first V CCDs. Then, signal charges in each second photodiode pair which are shifted one-half pitch along the vertical direction are transferred to the second V CCDs B through the first V CCDs. The signal charges stored in the second V CCDs and having different sampling point information are output form the H CCD.

The present invention is not restricted to the embodiment above. For example, for the horizontal CCD register a one line type, a two line type or more may be used. The field shift pulse for transferring signal charges to the first V CCDs is preferably applied in the horizontal blanking period. Also, a colorized system can be obtained by forming an appropriate filter arrangement onto the photosensing region. Otherwise a single chip color sensor or a three chip type color image sensor can be obtained.

Moveover, concerning to the photocell, photodiodes, MOS type detectors or stacked type detectors as shown in FIG. 6b may be used. The applications are not restricted to TV. For example, the system may be used in an electronic camera or OCR. Further, as for the clock pulses for the first and second V CCDs, it is not restricted to the four phase clock pulses. These embodiments also can be used when electronic zooming is performed. As for the drive pulse for vibrating the solid state image sensor chip, a drive pulse having other shapes such as triangle or sinusoidal may be used. A high frequency vibration having small amplitude may be added to the drive pulse for somewhat enlarging the area of the photocell. Prisms or other means for shifting the rays of incident image may be adopted instead of mechanical vibration. In the embodiment describe above, the temporary storage region has vertical CCDs of two groups; however, the structure of each second V CCD having parallel subdivided CCDs may be used if desired. Moreover, the switch inserted between the photosensing region and the temporary storage region may have one common electrode, the regions beneath which have different threshold voltages.

What is claimed is:

1. A solid state image sensor, comprising:
    a substrate;
    a photosensing region formed on said substrate, said photosensing region having a plurality of photocells for receiving an incident image to generate and to store signal charges therein;
    means for shifting the relation between said incident image and said photosensing region to change the image sampling points;
    a plurality of first transfer means formed in said photosensing region, each of said plurality of said first transfer means receiving, in one sampling cycle, said signal charges from adjoining photocells to store signal charges based on said received signal charges and to transfer said stored signal charges out;

a temporary storage region formed on said substrate having a plurality of second transfer means for receiving and storing charges transferred out from said plurality of first transfer means, said second transfer means being divided into groups corresponding, respectively, to said first transfer means, each of said groups of said second transfer means being able to be driven independently to receive all of said signal charges transferred out from said corresponding first transfer means, and each of said group of said second transfer means having a capacity to accommodate all of said signal charges stored in said corresponding first transfer means;

a plurality of gate means respectively formed between each of said first transfer means and said corresponding group of said second transfer means, each of said gate means having a transfer direction which alternates between said groups of said second transfer means so that one of said groups of said second transfer means independently receives and stores all of said signal charges received by said corresponding first transfer means during a signal sampling cycle; and third transfer means adjacent to said temporary storage region, said third transfer means having a repetitive readout cycle comprised of receiving signal charges from a plurality of said second transfer means and then transferring them out.

2. A solid state image sensor according to claim 1, wherein said sensor repeats a same vibration throughout every field, one cycle of vibration coincides with one field, and said signal charges stored in vibration positions of said photocells are synchronously transferred to said first transfer means with said vibration.

3. A solid state image sensor according to claim 1, wherein said signal charges stored in said photocells are combined in pairs in said first transfer means, and said combination of pairs are different between two fields.

4. A solid state image sensor according to claim 1, wherein said image sensor vibrates horizontally, and signal charges stored at a right side location of said photocells are transferred into a right side second transfer means, on the other hand, signal charges stored at a left side location of said photocells are transferred into a left side second transfer means, and both right side and left side signal charges are read out from said third transfer means at the same time.

5. A solid state image sensor according to claim 1, wherein one cycle of vibration coincides with one field and a vibration center of said vibration coincides substantially with a midpoint of said one field.

6. A solid state image sensor, comprising;

a substrate;

a photosensing region formed on said substrate, said photosensing region having a plurality of photocells for receiving an incident image to generate and to store signal charges therein;

means for changing image sampling modes by relatively shifting image sampling points for said incident image;

a plurality of first transfer means formed in said photosensing region, each said first transfer means having adjoining photocells on both sides and receiving said signal charges from said adjoining photocells on both of said sides and transferring them out;

a temporary storage region formed on said substrate having a plurality of second transfer means for receiving and storing charges transferred out from said plurality of first transfer means, said second transfer means being divided into groups corresponding, respectively, to said first transfer means, each of said group of said second transfer means being able to be driven independently to receive all of said signal charges transferred out from said corresponding first transfer means, and each of said group of said second transfer means having a capacity to accommodate all of said signal charges stored in the corresponding first transfer means;

a plurality of gate means respectively formed between each of said first transfer means and said corresponding group of said second transfer means, each of said gate means having a transfer direction which alternates between said groups of said second transfer means so that one of said groups of said second transfer means independently receives and stores all of said signal charges received by said corresponding first transfer means during a signal sampling cycle; and third transfer means adjacent to said temporary storage region, said third transfer means having a repetitive readout cycle comprised of receiving signal charges from a plurality of said second transfer means and then transferring them out.

7. A solid state image sensor according to claim 6, wherein each of said first transfer means has a zig-zag channel, and signal charge packets are formed by combining said signal charges in said first transfer means from pairs of said photocells, and the combination of said signal charges is changed in order to obtain different sampling points.

8. A solid state image sensor according to claim 7, further comprising a plurality of second gate means disposed between said temporary storage region and said third transfer means, said second gate means selecting a connection between groups of said second transfer means and said third transfer means, and signal charges in said temporary storage region are read out row-by-row.

9. A solid state image sensor according to claim 7, wherein said photosensing region is vibrated relative to said incident image to obtain different image sampling points.

10. A solid state image sensor according to claim 7, wherein the photosensing region is vibrated horizontally relative to said incident image, said solid state image sensor further comprising:

a plurality of second gate means disposed between said second transfer means and said third transfer means; and a plurality of third gate means, wherein each of said third gate means respectively connects said groups of second transfer means through said plurality of second gate means.

11. A solid state image sensor, comprising:

a substrate;

a photosensing region formed on said substrate, said photosensing region having a plurality of photocells for receiving an incident image to generate and to store signal charges therein;

means for changing image sampling modes for said incident image;

a plurality of first transfer means formed in said photosensing region, each of said plurality of said first transfer means receiving said signal charges from adjoining photocells, and transferring out signal charges based on said received signal charges;

a temporary storage region formed on said substrate having a plurality of second transfer means for receiving and storing charges transferred out from said plurality of first transfer means, said second transfer means being divided into groups corresponding, respectively, to said first transfer means, each of said groups of said second transfer means being able to be driven independently to receive all of said signal charges transferred out from said corresponding first transfer means, and each of said group of said second transfer means having a capacity to accommodate all of said signal charges stored in said corresponding first transfer means;

a plurality of gate means respectively formed between each of said first transfer means and said corresponding group of said second transfer means, each of said gate means having a transfer direction which alternates between said groups of said second transfer means so that one of said groups of said second transfer means independently receives and stores all of said signal charges received by said corresponding first transfer means during a signal sampling cycle; and third transfer means adjacent to said temporary storage region, said third transfer means having a repetitive readout cycle comprised of receiving signal charges from a plurality of said second transfer means and then transferring them out, said temporary storage region comprising;

pairs of first and second channel regions, said first and second channel regions being arranged in parallel to each other;

parallel transfer electrodes formed crossing said first and second channel regions;

pairs of transfer electrodes, each of said electrodes in said pairs crossing said first and second channel regions at crossing positions, said pairs of electrodes being positioned above said parallel transfer electrodes at said crossing positions, certain of said pairs of transfer electrodes extending into spaces between said parallel transfer electrodes in said second channel regions, and the others of said transfer electrodes of said pairs of transfer electrodes extending into spaces between said parallel transfer electrodes in said second channel regions.

12. A solid state image sensor according to claim 11, wherein each of said transfer electrodes in said pairs of transfer electrodes has a comb shape.

13. A solid state image sensor according to claim 11, wherein four phase clock pulses are applied to said temporary storage region using two of said parallel transfer electrodes and two transfer electrodes of said pairs of transfer electrodes as a unit.

14. A charge coupled device comprising:

a semiconductor substrate;

first channel regions and second channel regions formed at a surface of said semiconductor substrate, said second channel regions being respectively arranged between said first channel regions;

parallel transfer electrodes formed crossing above said first and second channel regions;

pairs of transfer electrodes, each of said transfer electrodes in said pairs crossing said first and second channel regions at crossing positions, and said transfer electrodes of said pairs being positioned above said parallel transfer electrodes at said crossing positions, certain of said transfer electrodes in said pairs of transfer electrodes extending to spaces between said parallel transfer electrodes in said first channel regions, and the others of said transfer electrodes of said pairs of transfer electrodes extending to spaces between said parallel transfer electrodes in said second channel regions, wherein certain of said transfer electrodes of said pairs of transfer electrodes which extend into said spaces in certain of said channel regions are kept at a stable potential for preventing charge transfer while charge transfer in the other of said first and second channel regions is performed.

* * * * *